(12) United States Patent
Ghosh et al.

(10) Patent No.: US 10,785,900 B2
(45) Date of Patent: Sep. 22, 2020

(54) ELECTRICALLY CONDUCTIVE ARTICLE CONTAINING SHAPED PARTICLES AND METHODS OF MAKING SAME

(71) Applicant: 3M INNOVATIVE PROPERTIES COMPANY, St. Paul, MN (US)

(72) Inventors: Dipankar Ghosh, Oakdale, MN (US); Jeffrey W. McCutcheon, Baldwin, WI (US); Scott R. Culler, Burnsville, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 151 days.

(21) Appl. No.: 15/027,496

(22) PCT Filed: Nov. 10, 2014

(86) PCT No.: PCT/US2014/064728
§ 371 (c)(1),
(2) Date: Apr. 6, 2016

(87) PCT Pub. No.: WO2015/073346
PCT Pub. Date: May 21, 2015

(65) Prior Publication Data
US 2016/0249495 A1   Aug. 25, 2016

Related U.S. Application Data

(60) Provisional application No. 61/904,656, filed on Nov. 15, 2013.

(51) Int. Cl.
| | | |
|---|---|---|
| *H05K 9/00* | (2006.01) | |
| *H01B 1/24* | (2006.01) | |
| *H01B 1/20* | (2006.01) | |
| *H01B 1/22* | (2006.01) | |

(52) U.S. Cl.
CPC ............ *H05K 9/0064* (2013.01); *H01B 1/20* (2013.01); *H01B 1/22* (2013.01); *H01B 1/24* (2013.01)

(58) Field of Classification Search
CPC ... H01B 1/20; H01B 1/24; H01B 1/22; H05K 9/0064
See application file for complete search history.

(56) References Cited

U.S. PATENT DOCUMENTS

| | | |
|---|---|---|
| 3,475,213 A | 10/1969 | Stow |
| 4,684,678 A | 8/1987 | Schultz |
| 4,903,440 A | 2/1990 | Larson |
| 5,236,472 A | 8/1993 | Kirk |
| 5,443,876 A | 8/1995 | Koskenmaki |
| 8,034,137 B2 | 10/2011 | Erickson |
| 8,105,964 B2* | 1/2012 | Cawse ................. B32B 5/22  442/61 |
| 8,142,531 B2 | 3/2012 | Adefris |
| 8,142,891 B2 | 3/2012 | Culler |
| 2007/0164260 A1 | 7/2007 | Kuwajima |
| 2008/0116424 A1* | 5/2008 | Bandyopadhyay ...... C08K 3/08  252/513 |
| 2009/0127518 A1 | 5/2009 | Nagano et al. |
| 2009/0246358 A1* | 10/2009 | Winkel .................. C09D 5/24  427/98.5 |
| 2009/0311502 A1* | 12/2009 | McCutcheon ....... C09J 133/066  428/220 |
| 2010/0146867 A1 | 6/2010 | Boden |
| 2010/0219382 A1* | 9/2010 | Abe ........................ C09J 9/02  252/513 |
| 2012/0227333 A1 | 9/2012 | Adefris |
| 2013/0221287 A1 | 8/2013 | Takahash et al. |

FOREIGN PATENT DOCUMENTS

| | | |
|---|---|---|
| CN | 101288133 | 10/2008 |
| CN | 103231072 | 8/2013 |
| CN | 103260795 | 8/2013 |
| EP | 1947654 | 7/2013 |
| JP | 2004-035686 | 2/2004 |
| JP | 2007-305576 | 11/2007 |
| JP | 2008-223058 | 9/2008 |
| JP | 2011-150836 | 8/2011 |

(Continued)

OTHER PUBLICATIONS

"Encyclopedia of Polymer Science and Engineering", John Wiley & Sons, 1988, vol. 11, pp. 45-92.

(Continued)

*Primary Examiner* — Cheng Yuan Huang
(74) *Attorney, Agent, or Firm* — Adrian L. Pishko

(57) ABSTRACT

Electrically conductive articles are provided, including a composite including (a) a resin, and (b) electrically conductive shaped particles distributed in the resin, the particles having a monosized distribution. Each particle has a shape including at least a first surface and a second surface intersecting the first surface at an angle a between about 5 degrees and about 150 degrees. The composite has a thickness and often each of the electrically conductive shaped particles distributed in the resin is oriented within the resin such that the particle does not extend beyond the thickness of the composite. A method for making an electrically conductive article is also provided, including (a) providing electrically conductive shaped particles having a monosized distribution, and (b) distributing the particles into a resin to form a composite.

24 Claims, 5 Drawing Sheets

(56) References Cited

FOREIGN PATENT DOCUMENTS

| WO | WO 2006-121194 | 11/2006 |
| WO | WO 2008-014169 | 1/2008 |

OTHER PUBLICATIONS

Ghosh, "Crack Propagation And Fracture Resistance Behavior Under Fatigue Loading Of a Ceramic Matrix Composite", Advances in Ceramic Matrix Composites, 2002, vol. 139, pp. 113-125.
Pocius, Adhesion and Adhesives Technology, 1997, pp. 185-188.
International Search Report for PCT International Application No. PCT/US2014/064728, dated Jan. 20, 2015, 3pgs.

\* cited by examiner

ELECTRICALLY CONDUCTIVE ARTICLE CONTAINING SHAPED PARTICLES AND METHODS OF MAKING SAME

CROSS REFERENCE TO RELATED APPLICATIONS

This application is a national stage filing under 35 U.S.C. 371 of PCT/US2014/064728, filed Nov. 10, 2014, which claims the benefit of U.S. Application No. 61/904656, filed Nov. 15, 2013, the disclosure of which is incorporated by reference in its/their entirety herein.

FIELD

Electrically conductive articles including shaped particles distributed in a resin, and methods of making such electrically conductive articles are provided.

BACKGROUND

An increasing trend in portable and compact electronic devices, such as mobile handheld devices, is the need for electromagnetic interference (EMI) solutions for reducing EMI noise and crosstalk and keeping unwanted signals to a minimum. An advantage of electrically conductive articles, for example transfer tapes, is that they are long-lasting and can eliminate the need for screws and mechanical fasteners while providing for contact grounding and EMI shielding in the bond line gap or slit of an assembly.

EMI shielding can be achieved utilizing a metallic structure, for instance. However, EMI solutions are also being made in polymer composite forms due to the lightweight nature of polymer composites as compared to metals. EMI tape, for example, is commonly used including an electrically conductive filler in an adhesive. The filler loading level is typically varied to provide a desired electrical conductivity for both grounding and EMI applications. A typical filler includes coated sphere shaped particles with a wide particle size distribution (e.g., particles having a diameter ranging from 20 microns ($\mu$m) to 50 $\mu$m). Disadvantages of the wide size distribution of commercially available fillers in electrically conductive adhesive materials include that most of the particles are not utilized optimally as far as electrical conductivity is concerned and that long term electrical and adhesive performance of the materials is not maximized.

SUMMARY

Electrically conductive articles are provided, containing shaped particles distributed in a resin. In a first aspect, an electrically conductive article is provided, including a composite including (a) a resin, and (b) electrically conductive shaped particles distributed in the resin, the particles having a monosized distribution. Each particle has a shape including at least a first surface and a second surface intersecting the first surface at an angle $\alpha$ between about 5 degrees and about 150 degrees. The composite has a thickness and optionally each of the particles distributed in the resin is oriented within the resin such that the particle does not extend beyond the thickness of the composite.

In a second aspect, a method for making an electrically conductive article is provided, including (a) providing electrically conductive shaped particles having a monosized distribution, and (b) distributing the electrically conductive shaped particles into a resin to form a composite. Each particle has a shape including at least a first surface and a second surface intersecting the first surface at an angle $\alpha$ between about 5 degrees and about 150 degrees. The composite has a thickness and optionally each of the particles distributed in the resin is oriented within the resin such that the particle does not extend beyond the thickness of the composite.

Figure 1:
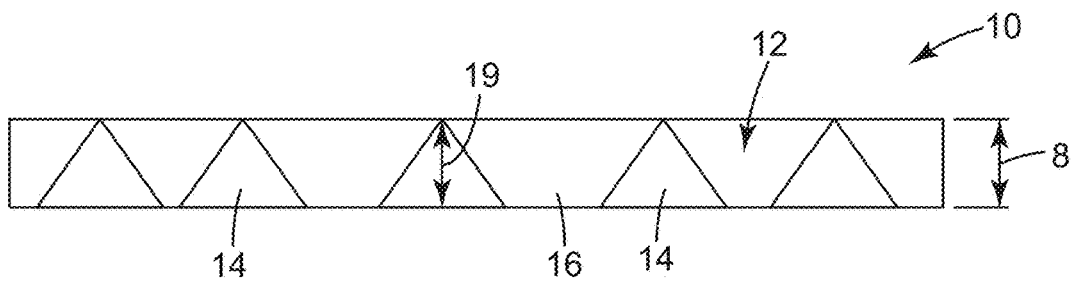
FIG. 1 is a cross-sectional schematic of an exemplary electrically conductive article including shaped particles comprising triangle shapes.

While the above-identified drawings, which may not be drawn to scale, set forth various embodiments of the present disclosure, other embodiments are also contemplated, as noted in the Detailed Description.

DETAILED DESCRIPTION

Methods and electrically conductive articles are provided having electrically conductive shaped particles distributed in a resin. More specifically, an electrically conductive article is provided, including a composite including (a) a resin, and (b) electrically conductive shaped particles distributed in the resin, the particles having a monosized distribution. Each particle has a shape including at least a first surface and a second surface intersecting the first surface at an angle $\alpha$ between about 5 degrees and about 150 degrees. The composite has a thickness and optionally each of the electrically conductive shaped particles distributed in the resin is oriented within the resin such that the particle does not extend beyond the thickness of the composite.

In a second aspect, a method for making an electrically conductive article is provided, including (a) providing electrically conductive shaped particles having a monosized distribution, and (b) distributing the electrically conductive shaped particles into a resin to form a composite. Each particle has a shape including at least a first surface and a second surface intersecting the first surface at an angle $\alpha$ between about 5 degrees and about 150 degrees. The composite has a thickness and optionally each of the electrically conductive shaped particles distributed in the resin is oriented within the resin such that the particle does not extend beyond the thickness of the composite.

There is a need for specific narrow size distribution electrically conductive particles having improved performance with respect to existing electrically conductive particles generally available in the market. For example, existing conductive tapes utilizing electrically conductive particles having a generally spherical shape have constraints on particle load limit, particle size, shape and cost. In contrast, precision shaped particles advantageously allow lower electrical contact resistance (R) values at the same particle loading. Since the size of each of the shaped electrically conductive particles is substantially the same as the thickness of the adhesive of the conductive tape when used in an application configuration, unlike the presently commercially available fillers, an advantage is gained with respect to particle utilization in the electrical performance of the tape and potentially also long term tape performance.

The recitation of any numerical range by endpoints is meant to include the endpoints of the range, all numbers within the range, and any narrower range within the stated range (e.g. 1 to 5 includes 1, 1.5, 2, 2.75, 3, 3.8, 4, and 5). Unless otherwise indicated, all numbers expressing quantities or ingredients, measurement of properties and so forth used in the specification and embodiments are to be understood as being modified in all instances by the term "about." Accordingly, unless indicated to the contrary, the numerical parameters set forth in the foregoing specification and attached listing of embodiments can vary depending upon the desired properties sought to be obtained by those skilled in the art utilizing the teachings of the present disclosure. At the very least, and not as an attempt to limit the application of the doctrine of equivalents to the scope of the claimed embodiments, each numerical parameter should at least be construed in light of the number of reported significant digits and by applying ordinary rounding techniques.

For the following Glossary of defined terms, these definitions shall be applied for the entire application, unless a different definition is provided in the claims or elsewhere in the specification.

GLOSSARY

Certain terms are used throughout the description and the claims that, while for the most part are well known, may require some explanation. It should be understood that, as used herein:

The term "a", "an", and "the" are used interchangeably with "at least one" to mean one or more of the elements being described.

The term "and/or" means either or both. For example, the expression "A and/or B" means A, B, or a combination of A and B.

The term "electrically conductive" refers to a material that exhibits a contact resistance to electricity through at least one plane of 1,000 ohms ($\Omega$) or less, preferably 100$\Omega$ or less, more preferably 10.0$\Omega$ or less, and most preferably 0.1$\Omega$ or less.

The term "shaped" with respect to a particle, refers to a particle with at least a portion of the particle having a shape that is the negative of a mold cavity. This is in contrast to particles having a random shape (e.g., due to being formed by grinding or crushing a larger material) and a size distribution associated with their original manufacturing process.

The term "monosized" distribution with respect to a distribution of particles refers to a distribution in which at least 90% of the particles in the distribution have a dimensional surface area that does not vary by more than 15% of the average surface area of all of the particles in the distribution. "Dimensional" surface area excludes the surface area of any pores in the surface of the particles. The dimensional surface area can further be determined by defining a central axis or a primary surface, for example, as a reference, followed by evaluation of the shaped particles for the shape dimensions, angles, planes, curvatures, slopes, and/or gradients with respect to the central axis or primary surface.

The term "height" with respect to a particle disposed in a composite refers to the dimension of the particle oriented in the same direction as the thickness of the composite.

The term "average particle size" refers to the mean length of the longest dimension, of a population of particles.

In a first aspect, an electrically conductive article is provided. More particularly, an electrically conductive article is provided comprising a composite comprising (a) a resin; and (b) electrically conductive shaped particles distributed in the resin, the particles having a monosized distribution, each particle comprising a shape comprising at least a first surface and a second precisely intersecting the first surface at an angle $\alpha$ between about 5 degrees and about 150 degrees; wherein the composite comprises a thickness.

In a second aspect, a method is provided. More specifically, the method comprises (a) providing electrically conductive shaped particles having a monosized distribution, each particle comprising a shape comprising at least a first surface and a second surface intersecting the first surface at an angle $\alpha$ between about 5 degrees and about 150 degrees; and (b) distributing the electrically conductive shaped particles into a resin to form a composite; wherein the composite comprises a thickness.

The following description of embodiments of the present disclosure relates to either one or both of the above aspects.

Figure 2:
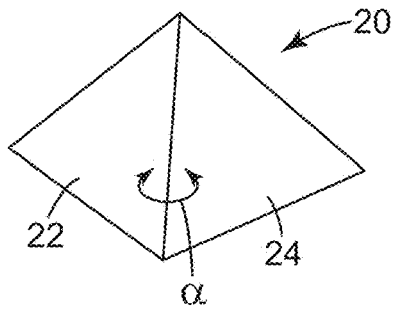
FIG. 2 is a perspective schematic of an exemplary electrically conductive shaped particle comprising a pyramid shape.

Each particle comprises at least a first surface and a second surface intersecting the first surface at an angle α between about 5 degrees and about 150 degrees. In many embodiments, the angle α of the second surface intersecting the first surface is between about 15 degrees and about 135 degrees, or between about 5 degrees and about 85 degrees, or between about 10 degrees and about 75 degrees, or between about 90 degrees and about 150 degrees. For example, the first surface optionally comprises at least one plane comprising a triangle shape, a diamond shape, a rectangle shape, a rhombus shape, a kite shape, a star shape, a hexagon shape, an octagon shape, a trapezoid shape, or a hemisphere shape. Optionally, one or more of the surfaces is curved rather than planar. Referring to FIG. 1, a cross-sectional schematic of an exemplary electrically conductive article 10 is provided, including a composite 12 comprising a plurality of electrically conductive shaped particles 14 comprising a triangle shape distributed in a resin 16. The composite comprises a thickness 8, and the height 19 of each of the electrically conductive shaped particles 14 is within 95% to 100% of the thickness 8 of the composite. Referring to FIG. 2, a perspective schematic of an exemplary electrically conductive shaped particle 20 is provided. The particle 20 comprises a pyramid shape, having at least a first surface 22 and a second surface 24 intersecting the first surface 22 at an angle α between about 5 degrees and about 150 degrees.

Figure 3:
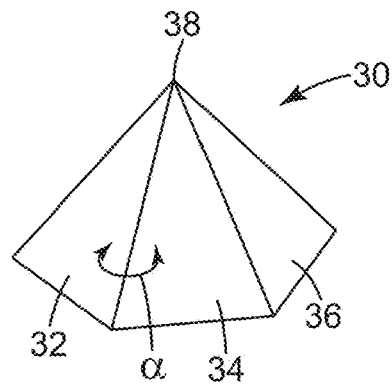
FIG. 3 is a perspective schematic of an exemplary electrically conductive shaped particle comprising a pyramid shape.

It was discovered that electrical conductivity in the z-axis (i.e., through the thickness of a composite) is improved when the shapes of the shaped particles are non-spherical as compared to spherical. Moreover, electrical conductivity in the z-axis is improved when the shape of each of the shaped particles comprises at least one point, as compared to comprising a spherical or an otherwise rounded-off shape. Accordingly, in select embodiments, each of the electrically conductive shaped particles comprises a shape comprising at least three surfaces meeting in a point. Referring to FIG. 3, a perspective schematic of an exemplary electrically conductive shaped particle 30 is provided. The particle 30 comprises a pyramid shape, having at least a first surface 32, a second surface 34 intersecting the first surface 32 at an angle α between about 5 degrees and about 150 degrees, and a third surface 36. The particle 30 comprises a pyramid shape comprising at least three surfaces (32, 34, and 36) meeting in a point 38.

Figure 4:
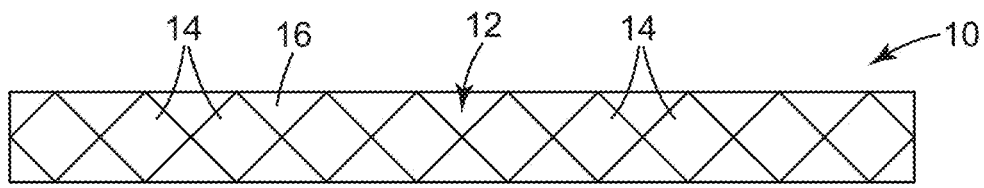
FIG. 4 is a cross-sectional schematic of an exemplary electrically conductive article including shaped particles comprising diamond shapes.
Figure 5:
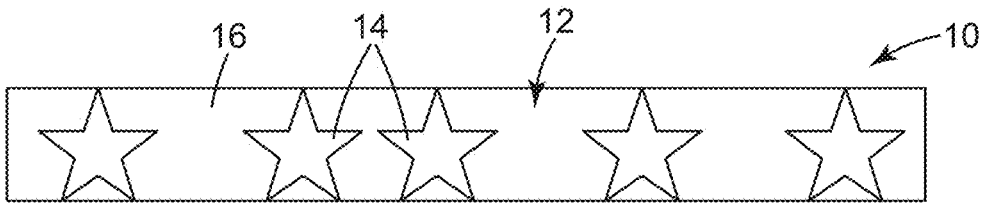
FIG. 5 is a cross-sectional schematic of an exemplary electrically conductive article including shaped particles comprising star shapes.
Figure 6:
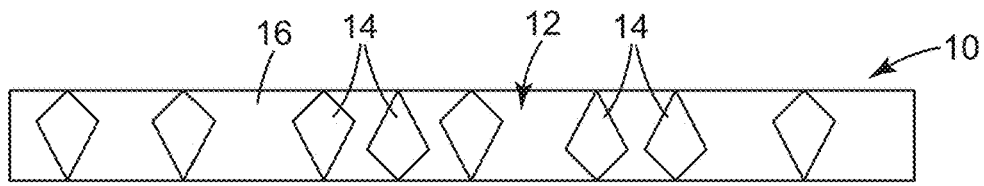
FIG. 6 is a cross-sectional schematic of an exemplary electrically conductive article including shaped particles comprising kite shapes.
Figure 7:
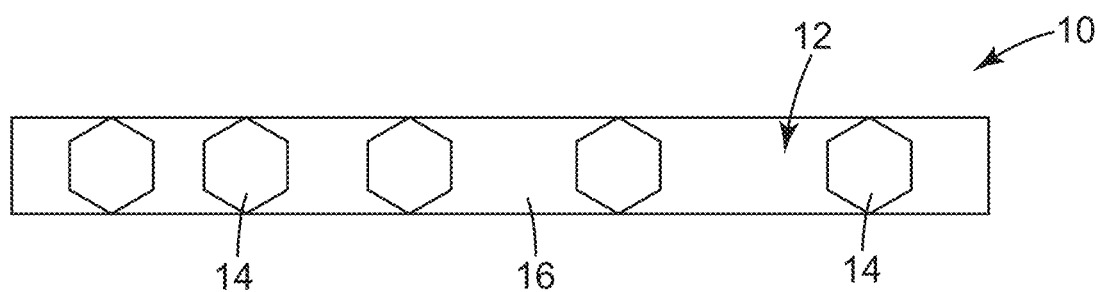
FIG. 7 is a cross-sectional schematic of an exemplary electrically conductive article including shaped particles comprising hexagon shapes.

In some embodiments, each of the electrically conductive shaped particles comprises a pyramid shape, a cone shape, a cube shape, a frusto-pyramid shape, a truncated sphere shape, or a frusto-conical shape. Preferably, each of the electrically conductive shaped particles comprises a three-sided pyramid shape, a four-sided pyramid shape, a five-sided pyramid shape, a five-sided triangle shape, or a diamond shape. FIG. 4 provides a cross-sectional schematic of an exemplary electrically conductive article 10, including a composite 12 comprising a plurality of electrically conductive shaped particles 14 comprising a diamond shape distributed in a resin 16. FIG. 5 provides a cross-sectional schematic of an exemplary electrically conductive article 10, including a composite 12 comprising a plurality of electrically conductive shaped particles 14 comprising a star shape distributed in a resin 16. FIG. 6 provides a cross-sectional schematic of an exemplary electrically conductive article 10, including a composite 12 comprising a plurality of electrically conductive shaped particles 14 comprising a kite shape distributed in a resin 16. FIG. 7 provides a cross-sectional schematic of an exemplary electrically conductive article 10, including a composite 12 comprising a plurality of electrically conductive shaped particles 14 comprising a hexagon shape distributed in a resin 16. As long as the height of each of the differently shaped particles is within 95% of the thickness of the composite when in use (e.g., subjected to compression between two materials), electrically conductive shaped particles comprising more than one shape are optionally included in a composite.

Typically, the electrically conductive article is employed to adhere two materials together. The electrically conductive article in such embodiments usually comprises a composite having a first major surface, a second major surface opposite the first major surface, and a thickness between the first and second major surfaces. Exemplary thicknesses of the composite for certain embodiments of the electrically conductive article, comprises a thickness between 5 µm and 500 µm, or between 5 µm and 1000 µm, or between 5 µm and 25 µm, or between 10 µm and 35 µm, or between 10 µm and 50 µm, or between 30 µm and 100 µm. The average particle size of the electrically conductive shaped particles will depend on the thickness of the composite when in use. This is due to the discovery that electrical conductivity in the z-axis (i.e., the thickness of the composite) is optimized when the height of the electrically conductive shaped particles is within about 95% of the thickness of the composite when in use (e.g., subjected to compression between two materials). In certain embodiments, the height of at least 90% of the shaped particles is within 96% of the thickness of the composite when in use, or within 97%, or within 98%, or within 99%, or at 100% of the thickness of the composite when in use. In contrast, a height of an electrically conductive shaped particle that is greater than the thickness of the composite will negatively impact adhesion of the article. In certain embodiments, the electrically conductive shaped particles comprise an average particle size of between 5 µm and 200 µm, or between 5 µm and 50 µm, or between 5 µm and 25 µm, or between 10 µm and 35 µm, or between 30 µm and 75 µm, or between 50 µm and 75 µm.

As noted above, for convenience the term "height" is employed to refer to the dimension of a particle oriented in the same direction as the thickness of a composite. More generally, electrically conductive shaped particles are typically present in a composite in a variety of alignments, thus they are described as each of the electrically conductive shaped particles being distributed in the resin oriented within the resin such that the particle does not extend beyond the thickness of the composite. In other words, each of the electrically conductive shaped particles is located (or oriented) to be at or within the limit of the thickness of the composite, or each of the electrically conductive shaped particles is aligned to be fully contained within the composite, or no part of any of the electrically conductive shaped particles is located outside of the composite. Such an orientation may be achieved by employing a coating method that includes a means for controlling the thickness of the composite (e.g., a bar notch coater). In particular, any shaped particles that are oriented to have a height beyond the composite thickness are forced (e.g., pushed over) into an alternate orientation in which the shaped particle no longer extends beyond the thickness of the composite.

The composite will typically be subjected to compression when the electrically conductive article is employed, for example when adhering two materials together. To provide a composite in which electrically conductive shaped particles have a height that is within a certain percent of the thickness of the composite when in use as disclosed above, the initial composite (i.e., the composite as formed and prior to use in adhering two materials together) will need to have a thickness greater than the thickness when compressed in use. In many embodiments, each of the plurality of electrically conductive shaped particles comprises a height that is within 25% of the initial composite thickness, or within 50%, or within 75%, or within 90%, or within 95% of the thickness of the initial composite. The composite in the electrically conductive article when utilized in an application, thus, can be compressed from 0% to 75% of the thickness of the initial composite, or from 0% to 50%, or from 1 to 10% of the thickness of the initial composite.

Moreover, if the composite comprises thermoplastic and/or thermoset characteristics, flows with heat and or pressure, is a liquid, is porous (e.g., foamed), and/or comprises a low molecular weight resin, the capacity of the composite to be reduced in thickness from the initial composite (i.e., a "pre-application condition") to the composite when in use (i.e., a "post application condition") dictates a "Post/Pre" Ratio Factor (PPRF) that can be applied to the pre-application shaped particle height features. Hence, a composite comprising a material with a PPRF factor of 0.5 indicates that the composite will be intentionally reduced in thickness before shaped particles contact desired surfaces and thus the "thickness" range is multiplied by a factor of 0.5 (or range) to indicate the shaped particle size is within a pre-application composite thickness. Example intentional decreases in thickness of the composite include for instance employing some of the composite resin to make fillets, fill areas that are not flat, fill voids, and form pins, etc., between substrates.

In certain end use applications, the resin portion of the composite can be displaced to allow the shaped particles to engage, contact, and/or embed within a desired surface. Such resin displacement can occur by many means such as by flow characteristics of the resin under pressure, heat, vibration, compressibility of the resin (e.g., it may have a foamed structure, be a thermoplastic, and/or be a thermoset resin.) Any practical resin and/or shaped particle carrier means (e.g., solders, pastes, greases, gels, or films) can be utilized in the application that allows the particle to engage desired surfaces when in use. Further, in certain embodiments the resin can be designed to have adhesive functions or non-adhesive functions in an end use. For non-adhesive functionality, mechanical clamps, gravity, and/or van der waals forces, for instance, may be employed to hold together the assembly.

In certain embodiments, the article in use (e.g., following compression of the article against a material surface) can be described as a composite having a shaped particle plane and a resin carrier plane. The shaped particle plane can extend past the resin plane, into a material surface (i.e., past the material surface plane), with the resin unable to protrude past the material surface plane for mechanical reasons during assembly (e.g., application pressure, time, heat, force, etc.). The shaped particle plane in such a case is typically located somewhat past the nominal plane of the material surface. In contrast, a portion of an electrically conductive shaped particle that extends beyond the thickness of the composite will negatively impact adhesion of the article when in use if two rigid material surfaces are used that prevent embedding of the shaped particles and the shaped particles extend past the resin composite thickness following compression. In such a case, the shaped particles extending past the resin plane are not able to protrude into the material for various reasons (e.g., hardness, application pressure, etc.), and the shaped particles would in effect act as stand-offs, limiting the resin from making surface contact and forming an attachment.

Advantageously, the monosized shaped particles allow for a much greater percent of the shaped particles to be effectively engaged with a surface for electrical conductivity (and optionally thermal conductivity) of the shaped particles versus a typical distribution of random particles and/or fillers. The normal distribution size particles when used with certain hard materials into which the particles may not be able to significantly embed or protrude will define a gap between a composite and a material surface. Thus, a small percent of the normal distribution particles may only be in contact with material surfaces while most are not contacting one or either material surface when in use.

As discussed above, the term a "monosized" distribution of particles refers to a distribution of particles in which at least 90% of the particles in the distribution has a surface area that does not vary by more than 15% of the average surface area of all of the particles in the distribution. Preferably, the surface area does not vary by a smaller amount, for example in certain embodiments at least 90%, or at least 95%, or at least 98% of the particles in the monosized distribution comprises a surface area that does not vary by more than 12% of the average surface area of all of the particles in the distribution, or by more than 10%, or by more than 8%, or by more than 6%, or by more than 5%, or by more than 4%, or by more than 3%, or by more than 2% or by more than 1% of the average surface area of all of the particles in the distribution.

In contrast to a monosized distribution of shaped particles, electrically conductive particles have previously typically exhibited a broader distribution of particles obtained by methods such as sieving a population of particles having a very wide size distribution. The narrower the size dispersion required, the more sieving (or other separation) processes that are needed, and the greater the amount of discarded particles that are collected as being outside the selected narrow size dispersion. Typically, particles that have a random shape obtained by crushing, grinding, etc., of a larger material, also have a wide variation in aspect ratio, making them difficult to sieve into a narrow size distribution. Accordingly, methods such as sieving require more process steps and materials, and are thus often less cost- and time-efficient than the embodiments employing shaped particles disclosed herein. Moreover, even a relatively narrow size distribution of sieved particles will typically include many particles that do not have a height within a certain percentage of the thickness of a composite when in use, as well as some particles that have a height greater than the thickness of the composite. The shorter particles are generally ineffective at providing electrical conductivity in the z-axis (i.e., through the thickness of the resin layer) and the taller particles generally decrease the adhesion of the article to an adjacent material.

In a comparative electrically conductive article comprising a composite containing a statistically normal height-width distribution of randomly shaped particles, the percent of the particles that are in actual contact between two material surfaces when such an electrically conductive article is in use is typically less than 10%, and more often less than 5%. In contrast, an electrically conductive article comprising a composite according to the disclosure, identical except for comprising monosized electrically conductive shaped particles instead of randomly shaped particles, will have a higher percentage of particles contacting the desired material surfaces. Preferably more than 10% of the monosized electrically conductive shaped particles are in contact with at least one material surface, preferably greater than 30%, more preferably greater than 50%, and optimally greater than 75% of the monosized electrically conductive shaped particles are in contact with at least one material surface, when the electrically conductive article is in use.

Figure 8:
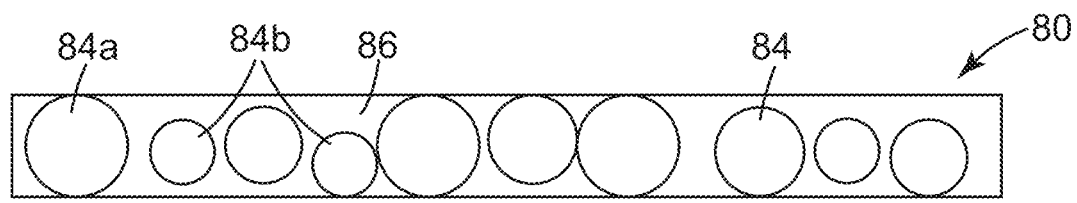
FIG. 8 is a cross-sectional schematic of a prior art electrically conductive article containing sieved particles.

FIG. 8 provides a cross-sectional schematic of an exemplary prior art electrically conductive article 80, including a plurality of sieved electrically conductive spherical particles 84 distributed in a resin 86. For instance, an electrically conductive article 80 having a thickness of 50 μm, for example, containing sieved substantially spherical electrically conductive particles 84 would typically contain particles ranging in nominal size from about 20 μm to about 50 μm. The particles 84a having a diameter close to 50 μm can participate in z-axis conductivity of the article 80, but the particles 84b having a smaller diameter (e.g., a diameter closer to 20 μm) are generally too far from at least one of the major surfaces of the resin to participate in z-axis conductivity. By eliminating an amount of ineffective particles, embodiments according to the present disclosure advantageously require a smaller loading of electrically conductive particles to achieve the same conductivity as when employing a wider size distribution of electrically conductive particles.

The amount of electrically conductive shaped particles in the electrically conductive article of the present disclosure is optionally expressed in terms of its percent by weight of the composite or in terms of its percent by volume of the composite. The use of shaped particles having a narrow size distribution allows the addition of lower loadings of the shaped particles as compared to particles having a wider size distribution, to achieve the same electrical conductivity. In certain embodiments, the composite comprises between 1 wt. % and 95 wt. % of the electrically conductive shaped particles. In certain embodiments, the composite comprises up to 95 wt. % of the electrically conductive shaped particles, or up to 75 wt. %, or up to 50 wt. %, or up to 30 wt. %, or up to 10 wt. % of the electrically conductive shaped particles. In certain embodiments, the composite comprises at least 1 wt. % of the electrically conductive shaped particles, or at least 5 wt. %, or at least 10 wt. %, or at least 15 wt. %, or at least 20 wt. %, or at least 25 wt. % of the electrically conductive shaped particles. In certain embodiments, the composite comprises between 0.1 volume percent (vol. %) and 25 vol. % of the electrically conductive shaped particles. In certain embodiments, the composite comprises up to 25 vol. % of the electrically conductive shaped particles, or up to 20 vol. %, or up to 15 vol. %, or up to 10 vol. %, or up to 5 vol. % of the electrically conductive shaped particles. In certain embodiments, the composite comprises at least 0.1 vol. % of the electrically conductive shaped particles, or at least 0.5 vol. %, or at least 1 vol. %, or at least 5 vol. %, or at least 10 vol. % of the electrically conductive shaped particles Providing the electrically conductive shaped particles according to most embodiments typically comprises molding a core of each of the electrically conductive shaped particles. Several suitable molding methods are described in detail in each of U.S. Pat. No. 8,034,137 (Erickson et al.), U.S. Pat. No. 8,142,531 (Adefris et al.), and U.S. Pat. No. 8,142,891 (Culler et al.), and U.S. Application Publication Nos. 2012/0227333 (Adefris et al.), and 2010/0146867 (Boden et al.). As discussed above, the ability to employ a plurality of particles manufactured to have a monosized dispersion and shape corresponding to the shape of a mold cavity provides an efficient way to provide electrical conductivity to a composite, such as for an electrically conductive article.

Figure 9:
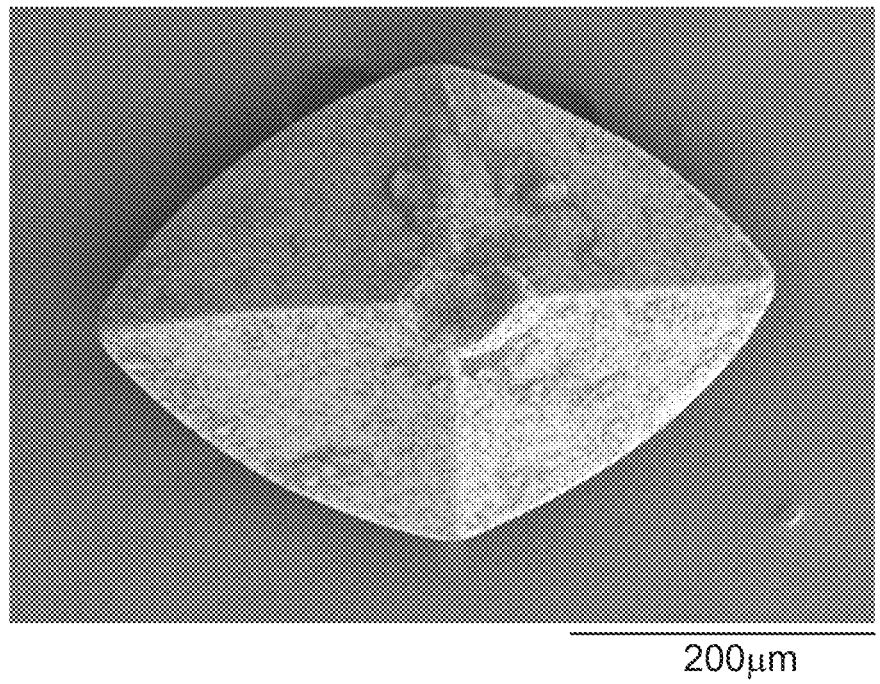
FIG. 9 is a scanning electron microscope (SEM) image of an electrically conductive shaped particle.
Figure 10:
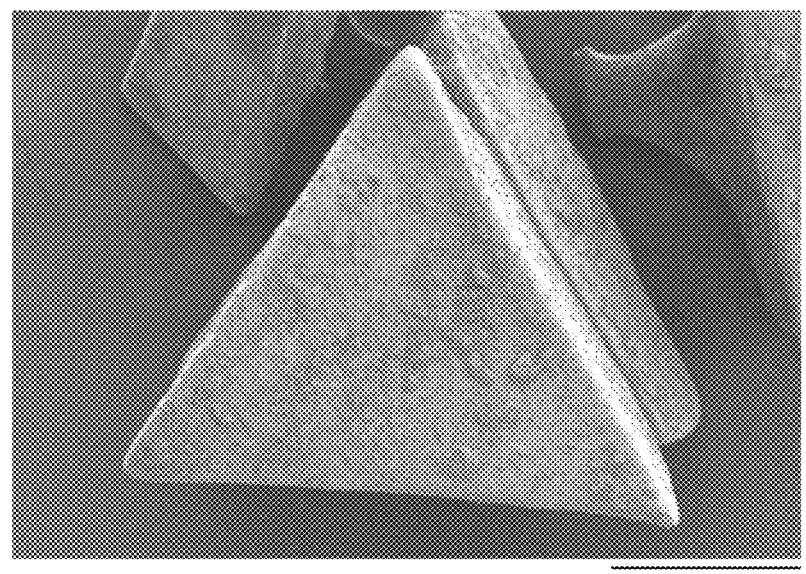
FIG. 10 is an SEM image of an electrically conductive shaped particle.

Typically, the electrically conductive shaped particles employed have sufficient mechanical strength to be utilized in applications requiring structural integrity. In certain embodiments, the electrically conductive shaped particles comprise a core comprising a Young's modulus of from 0.01 GigaPascal (GPa) to 1,000 GPa, more preferably from 1 GPa to 100 GPa, and most preferably from 10 GPa to 400 GPa. In certain embodiments, each of the electrically conductive shaped particles comprises a core comprising alumina, zirconia, yttria, yttria-stabilized zirconia, silica, titanium carbide, boron carbide, boron nitride, or silicon carbide, and often the core comprises alumina FIG. 9 provides a scanning electron microscope (SEM) image of a shaped particle formed of alumina having the shape of a truncated pyramid with four side facets, a base, and a top surface (provided by the truncation of the pyramid). Similarly, FIG. 10 provides a SEM image of a five-sided triangle shaped particle formed of alumina.

Providing the electrically conductive shaped particles usually further comprises applying a metal coating to the core of each of the electrically conductive shaped particles to form the electrically conductive shaped particles. The method of coating the cores is not particularly limited, for example and without limitation the metal coating optionally comprises sputtering the metal onto the core of each of the electrically conductive shaped particles.

Figure 11A:
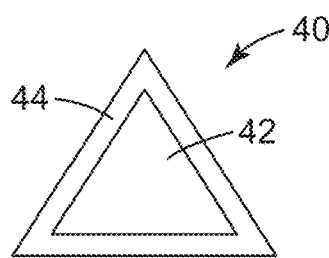
FIG. 11A is a cross-sectional schematic of an exemplary electrically conductive shaped particle comprising a triangle shape.
Figure 11B:
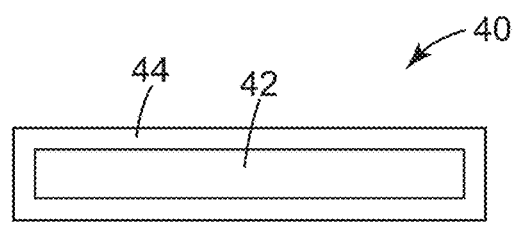
FIG. 11B is a cross-sectional schematic of an exemplary electrically conductive shaped particle comprising a rectangle shape.

Each of the metal coated electrically conductive shaped particles generally comprises a metal coating having an average thickness between 1 micrometer (μm) and 50 μm, or between 1 micrometer (μm) and 20 μm, or between 1 micrometer (μm) and 10 μm. For example and without limitation, the metal coating comprises aluminum, silver, copper, nickel, gold, or alloys thereof, and often silver or copper. FIG. 11A provides a cross-sectional schematic of an exemplary electrically conductive shaped particle 40 comprising a triangle shape, having a core 42 and a metal coating 44. FIG. 11B provides a cross-sectional schematic of an exemplary electrically conductive shaped particle 40 comprising a rectangle shape, having a core 42 and a metal coating 44.

In embodiments according to the disclosure, each of the electrically conductive shaped particles comprising a metal coating comprises between 10 percent by weight (wt. %) metal and 40 wt. % metal. In certain embodiments, each of the electrically conductive shaped particles comprises a metal coating comprising up to 70 wt. %, or up to 40 wt. % metal, or up to 25 wt. % metal, or up to 20 wt. % metal, or up to 15 wt. % metal. In certain embodiments, each of the electrically conductive shaped particles comprises a metal coating comprising at least 1 wt. % metal, or at least 10 wt. % metal, or at least 15 wt. % metal, or at least 25 wt. % metal. Preferably, each of the electrically conductive shaped particles comprises a metal coating comprising at least 15 wt. % metal. It was discovered that a metal coating level of 15 wt. % or greater typically ensured that sufficient metal was coated on the surface of each of the particles to adequately cover each of the facet surfaces and the edges of the formed surfaces, achieving reliable conductivity from one surface facet to another adjacent facet across an edge.

In alternate embodiments, the core of each of the electrically conductive shaped particles comprises a metal. For instance, each of the electrically conductive shaped particles optionally comprises a core comprising aluminum, silver, copper, gold, or alloys thereof.

In some embodiments, the majority of the electrically conductive shaped particles are oriented in the resin of the composite in substantially the same direction. For example, the intersection of the first surface and the second surface of at least 30% of the electrically conductive shaped particles is oriented in the resin normal to a major surface of the composite, or at least 70%, or at least 80%, or at least 90%, or at least 95%, or at least 98% of the electrically conductive shaped particles is oriented in the resin normal to a major surface of the composite.

The resin of the electrically conductive article is not particularly limited, and will typically depend on the specific application for which the article is intended. For example, in certain embodiments the resin comprises a thermoset polymer, a thermoplastic polymer, or an elastomeric polymer. In certain embodiments, the resin comprises a pressure-sensitive adhesive, a liquid adhesive, a hot melt adhesive, and/or a structural adhesive (e.g., either a 1- or 2-part adhesive). More specifically, the resin optionally comprises an epoxy, a polyurea, an acrylic, a cyanoacrylate, a polyamide, a phenolic, a polyimide, a silicone, a polyester, an aminoplast, a melamine, an acrylated epoxy, a urethane, polyvinyl chloride, or a combination thereof.

The resin may include a thermosetting material or a thermoplastic material. The term "material" as used herein refers to monomers, oligomers, prepolymers, and/or polymers. The resin may include optional additives, and in the case of a resin material including a thermosetting material, may also include a curative or curatives. The term "curative" is used broadly to include not only those materials that are conventionally regarded as curatives but also those materials that catalyze or accelerate the reaction of the curable material as well as those materials that may act as both curative and catalyst or accelerator.

The term "thermoplastic" as used herein refers to a material which undergoes a physical change upon the application of heat, i.e., the material flows upon heating and returns to its initial non-flowing state upon cooling. A thermoplastic material is typically bonded by application of heat and/or pressure. Thermoplastic adhesives can include hot-melt adhesives. Hot melt adhesive can include natural or synthetic rubbers, butyl rubber, nitrile rubbers, synthetic polyisoprene, ethylene-propylene rubber, ethylene-propylene-diene monomer rubber (EPDM), polybutadiene, polyisobutylene, poly(alpha-olefin), styrene-butadiene random copolymer, fluoroelastomers, silicone elastomers, and combinations thereof. An alternative to rubber includes polyvinyl chloride (PVC) resins, which are formed by polymerization of the monomer vinyl chloride (VCM).

The term "thermosetting" as used herein refers to a material, which undergoes a curing reaction that results in a chemical change upon bonding and an increase in the hardness of the material. The term "thermoset" as used herein refers to a thermosetting material which has been cured. A thermosetting material may generally be bonded by application of heat, actinic radiation such as UV, visible, or infrared, or microwave or X-ray energy. A thermosetting material may also be caused to cure by mixing two reactive components, for example, by mixing a monomer mixture or oligomer mixture with a curative mixture. The resin of the present disclosure can include a heat bondable material which, upon application of heat, undergoes an initial decrease in viscosity which promotes wetting of a substrate in which the article is in contact, and enhances adhesion and, in the case of, for example, a thermosetting material, causes a curing reaction. Typical thermosetting adhesives can be epoxy-based adhesives such as, for example, ethylene-glycidyl (meth)acrylate copolymers, phenolic-based adhesives, or (meth)acrylic adhesives. These adhesives can be crosslinked thermally, reactively (including moisture-cured), or photochemically. The resin often includes acrylic pressure-sensitive adhesives. Typically, the acrylic pressure-sensitive adhesives are substantially solventless and are UV or visible-light curable.

Suitable acrylic adhesives include free radically-curing acrylics and cyanoacrylates. The term "(meth)acrylic" as used herein refers to acrylic and methacrylic. The acrylic adhesives can include conventional additives such as plasticizers, tougheners, flow modifiers, neutralizing agents, stabilizers, antioxidants, fillers, colorants, and the like.

Suitable free radically-curing acrylics can include, but are not limited to, those formed from methyl methacrylate, methacrylic acid, tetrahydrofurfuryl methacrylate, isobornyl acrylate, and isobornyl methacrylate. Multifunctional (meth) acrylic acid esters can optionally be included as crosslinking agents. These multifunctional (meth)acrylates can include, but are not limited to, ethylene glycol dimethacrylate, 1,6-hexanediol dimethacrylate, 1,6-hexanediol diacrylate, trimethylolpropane triacrylate, pentaerythritol tetraacrylate, 1,2-ethylene glycol diacrylate, the dimethacrylate of ethylene oxide modified bisphenol A and the diacrylate of ethylene oxide modified bisphenol A.

The (meth)acrylic adhesives can be cured through free radical initiated polymerization. In one type of polymerization, the free radicals are generated by a redox reaction. Redox initiators can include peroxides, hydroperoxides, metal ions, saccharin, and N,N-dimethyl-p-toluidine. The free radicals can be generated in a two-part adhesive system that cures at room temperature after mixing or in a one-part adhesive system. The polymerization of the (meth)acrylic adhesive monomers to form a polymer useful in the present disclosure can be carried out using thermal energy, electron-beam radiation, ultraviolet radiation, and the like. Such polymerizations can be facilitated by a polymerization initiator, which can be a thermal initiator or a photoinitiator. Examples of suitable photoinitiators include, but are not limited to, benzoin ethers such as benzoin methyl ether and benzoin isopropyl ether, substituted benzoin ethers such as anisoin methyl ether, substituted acetophenones such as 2,2-dimethoxy-2-phenylacetophenone, and substituted alpha-ketols such as 2-methyl-2-hydroxypropiophenone.

Cyanoacrylate adhesives can include those formed from methyl cyanoacrylate and ethyl cyanoacrylate as well as other cyanoacrylate esters. They can optionally include additives such as hydroquinone. Preferably, the cyanoacrylate adhesive is chosen from adhesives sold by multiple companies under the name of Super Glue Gel, which have enhanced viscosity and appropriately long bondlines.

Suitable epoxy resins include those formed from monomers having at least two 1,2-cyclic ethers. Such compounds can be saturated or unsaturated, aliphatic, aromatic or heterocyclic, or can include combinations thereof. Suitable epoxides may be solid or liquid at room temperature. It is also within the scope of this disclosure to use a material with functionality in addition to epoxide functionality but which is essentially unreactive with the epoxide functionality, for example, a material containing both epoxide and acrylic functionality. An optional additive is a core-shell toughener. Examples of suitable epoxide-based adhesives that are commercially available include those available from 3M Company, St. Paul, Minn. under the trade designation "3M SCOTCH-WELD EPOXY ADHESIVE."

Suitable epoxy resin compositions may be made from thermally curable epoxy resins. The term epoxy resin composition will typically be used to refer to an uncured composition. An exemplary epoxy resin composition includes one or more aromatic polyepoxides and one or more 9,9-bis(aminophenyl)fluorene curing agents. Suitable aromatic polyepoxides include poly(glycidyl ether)s of polyhydric phenols and epoxy resins available from Shell Chemical Company, Houston, Tex., under the trade designations EPON 1001F and EPON 1050. Other suitable resins include blends of a diglycidylether of bisphenol A and a novolac epoxy, for example, 75 to 90% by weight EPON 1001F and 25 to 10% by weight EPON 1050F based on the total weight of the resin. Suitable curing agents for the epoxy resin compositions include, but are not limited to, di(4-aminophenyl)sulfone and 9,9-bis(aminophenyl)fluorene as described in U.S. Pat. No. 4,684,678.

Suitable urethane resins include polymers made from the reaction product of a compound containing at least two isocyanate groups (—N=C=O), referred to herein as "isocyanates", and a compound containing at least two active-hydrogen containing groups. Examples of active-hydrogen containing groups include primary alcohols, secondary alcohols, phenols and water. Other active-hydrogen containing groups include primary and secondary amines which react with the isocyanate to form a urea linkage, thereby making a polyurea. A wide variety of isocyanate-terminated materials and appropriate co-reactants are well known, and many are commercially available (see, for example, Gunter Oertel, "Polyurethane Handbook", Hanser Publishers, Munich (1985)). Urethane adhesives can include two-part room temperature-curing adhesives. Urethane adhesives can also include one-part moisture curing adhesives that are applied when warm including those available from 3M company, St. Paul, Minn. under the trade designation "3M SCOTCH-WELD POLYURETHANE REACTIVE ADHESIVES".

Suitable phenolic resins are generally described in "Encyclopedia of Polymer Science and Engineering", Volume 11, John Wiley & Sons, Inc. (New York, 1988), pp. 45-92. Phenolic-based resins are generally described in Alphonsus V. Pocius, "Adhesion and Adhesives Technology: An Introduction", Hanser Publishers (New York, 1997), pp. 185-188. Suitable phenolic materials are those made as the reaction product of phenols and formaldehydes, including resole phenolics and novolac phenolics. Examples of phenols include phenol, resorcinol, para-substituted phenol, cresol, and the reaction product of bisphenol-A and the monoglycidyl ether of bisphenol-A.

Suitable silicone resins include moisture-cured silicones, condensation-cured silicones, and addition-cured silicones, such as hydroxyl-terminated silicones, silicone rubber, and fluoro-silicone. Examples of suitable commercially available silicone pressure-sensitive adhesive compositions comprising silicone resin include Dow Corning's 280A, 282, 7355, 7358, 7502, 7657, Q2-7406, Q2-7566 and Q2-7735; General Electric's PSA 590, PSA 600, PSA 595, PSA 610, PSA 518 (medium phenyl content), PSA 6574 (high phenyl content), and PSA 529, PSA 750-D1, PSA 825-D1, and PSA 800-C. An example of a two-part silicone resin is commercially available under the trade designation "SILASTIC J" from Dow Chemical Company, Midland, Mich.

Suitable polyurea resins include those prepared by reacting an isocyanate-functional material with an amine-functional material. Preferably, the polyurea is included in a pressure-sensitive adhesive or a thermosetting adhesive. In certain embodiments, a polyurea-based polymer comprises a segmented copolymer, in which at least about 0.5 mole fraction of linkages between segments in a backbone of the polymer are urea linkages.

Polyester resins include polymers having monomer units linked together by an ester group, i.e., —COO—. Typically, polyester resins are formed by polymerizing a polyhydric alcohol with a polybasic acid. Exemplary polyester resins include polyethylene terephthalate (PET) and polyethylene terephtalate glycol (PETG).

Suitable polyimide resins include those prepared by reacting primary aliphatic diamines and dicarboxylic dianhydrides, such as reacting pyromellitic dianhydride with 4,4'-oxydianiline. Curing is typically accomplished by eliminating water via heating to close the imide rings present along the polymer chain, thereby forming the polyimide structure.

Polyamide resin materials are characterized by having an amide group, i.e., —C(O)NH—. The polyamide resin materials usually include polyamide hot melt adhesives. Suitable polyamides include for example terpolymers produced from lactams (such as lauryl lactam) and diamines Commercially available thermoplastic polyamides include those having the trade designations VESTAMELT 732, VESTAMELT 730, VESTAMELT 742, VESTAMELT 750/751, VESTAMELT 755, and VESTAMELT 760, from Creanova, Somerset, N.J.

Melamine resins are amino resins formed from a condensation polymerization of trimethylol melamine, typically also reacting with melamine and formaldehyde. Further, butylated melamine resins are optionally formed by including alcohols such as butyl during the polymerization.

Aminoplast resins are thermosetting adhesives formed by condensation of an amine-containing compound with an aldehyde. Suitable amine-containing compounds include for example melamine or urea. Some useful aminoplast resins can be monomeric or oligomeric. Typically, the aminoplast resins have at least one pendant α,β-unsaturated carbonyl group per molecule. These α,β-unsaturated carbonyl groups can be acrylate, methacrylate, or acrylamide groups. Examples of such resins include N-hydroxymethyl-acrylamide, N,N'-oxydimethylenebisacrylamide, ortho and para acrylamidomethylated phenol, acrylamidomethylated phenolic novolac, and combinations thereof. These materials are further described in U.S. Pat. Nos. 4,903,440 and 5,236,472, which are incorporated herein by reference.

The resin may comprise at least one of a grease or wax. Suitable commercially available greases, for instance, include non-silicone resin systems having the trade designations 3M THERMALLY CONDUCTIVE GREASE TCG-2035 AND 3M THERMALLY CONDUCTIVE GREASE TCG-2031, from 3M Company, St. Paul, Minn. Waxes include long alkyl chains, either with or without functional groups such as fatty acid esters and alcohols. Waxes or mixtures of waxes which may be used include materials of vegetable, animal, petroleum, and/or mineral derived origin. Representative waxes include carnauba wax, candelilla wax, oxidized Fischer-Tropsch wax, microcrystalline wax, lanolin; bayberry wax, palm kernal wax, mutton tallow wax, emulsifiable polyethylene wax, polyethylene copolymer wax, emulsifiable petroleum derived waxes, montan wax derivatives, emulsifiable polypropylene wax, and oxidized polyethylene wax.

Figure 12:
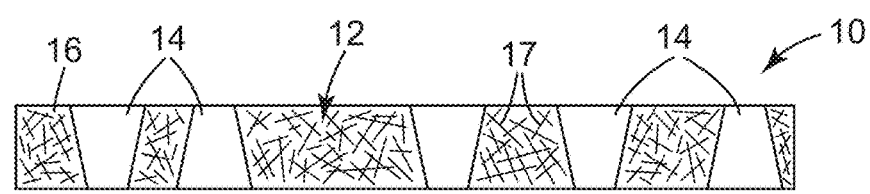
FIG. 12 is a cross-sectional schematic of an exemplary electrically conductive article including shaped particles comprising trapezoid shapes and including conductive fibers.
Figure 13:
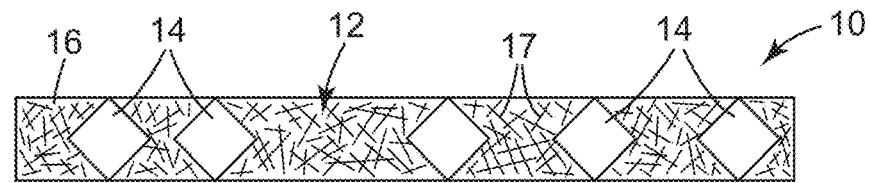
FIG. 13 is a cross-sectional schematic of an exemplary electrically conductive article including shaped particles comprising rhombus shapes and including conductive fibers.
Figure 14:
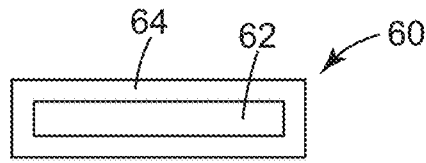
FIG. 14 provides a cross-sectional schematic of an exemplary conductive coated fiber.

To impart additional electrically conductive properties to the electrically conductive article, in some embodiments the composite further comprises a plurality of conductive fillers comprising an aspect ratio of length to height of greater than 2:1, or greater than 4:1, or greater than 10:1. The length is the longest dimension and the height is the smallest dimension (with the width equal to or greater than the height). Such conductive fillers typically provide conductivity in the x-y plane, which adds to the electrical conductivity in the z-axis being provided by the electrically conductive shaped particles in the composite. FIG. 12 is a cross-sectional schematic of an exemplary electrically conductive article 10, including a composite 12 comprising a plurality of electrically conductive shaped particles 14 comprising a trapezoid shape and a plurality of conductive fillers 17 distributed in a resin 16. FIG. 13 is a cross-sectional schematic of an exemplary electrically conductive article 10, including a composite 12 comprising a plurality of electrically conductive shaped particles 14 comprising a rhombus shape and a plurality of conductive fillers 17 distributed in a resin 16. The plurality of conductive fillers is not particularly limited, and optionally comprises fibers, shards, woven and/or nonwoven scrims, coated with metal. The fibers, shards, woven and nonwoven scrims comprise glass, polymer, carbon, or ceramic. FIG. 14 provides a cross-sectional schematic of an exemplary conductive coated fiber 60 comprising a needle shape, having a fiber 62 and a metal coating 64. Alternatively, the plurality of conductive fillers comprises carbon black or graphene based materials, for example doped or undoped graphene. Suitable graphene based materials comprise for example and without limitation, flakes, exfoliated graphite, graphene nanoplatelets, functionalized graphene sheets, or a combination thereof.

In certain embodiments, the electrically conductive article further comprises conductive and/or non-conductive fillers having a typical particle size distribution (i.e., not monosized), to enhance the performance of the article. Such fillers are used primarily to enhance EMI shielding EMI absorbing, and/or thermal conductivity of the composite, or to modify composite properties for shear strength, flow characteristics, fracture resistance, and/or environmental stability.

In certain embodiments, the electrically conductive article comprises a substrate, wherein the composite is attached to a major surface of the substrate. The substrate is not particularly limited, and often comprises a nonwoven material, a woven material, a metal foil, a polymer, or a (woven) fabric. Such substrates are often employed when the electrically conductive article comprises an adhesive tape.

Figure 15:
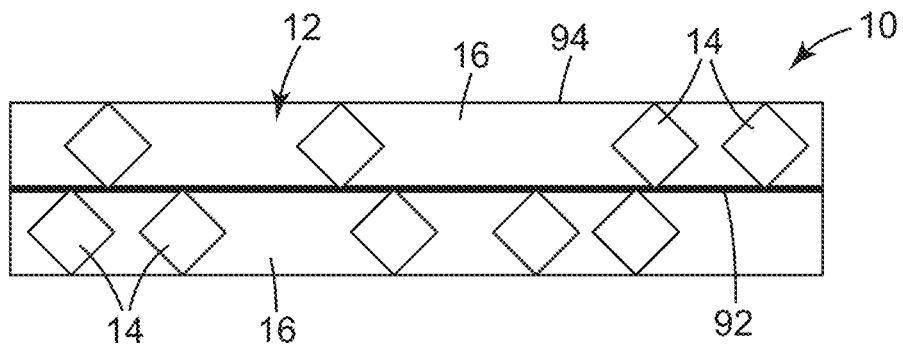
FIG. 15 is a cross-sectional schematic of an exemplary electrically conductive article including shaped particles comprising diamond shapes, and an interior substrate.

In certain embodiments, the electrically conductive article comprises a substrate provided between two layers of electrically conductive resin, thus providing a double-sided electrically conductive article. For example, FIG. 15 provides a cross-sectional schematic of an exemplary electrically conductive article 10, including a composite 12 comprising a plurality of electrically conductive shaped particles 14 comprising a diamond shape distributed in a resin 16, and an electrically conductive internal substrate 92 positioned approximately in the center of the thickness of the article 10. The height of the plurality of electrically conductive shaped particles 14 allows the particles to contact both the internal substrate 92 and one major surface 94, for instance, of the composite 12, thus two rows of electrically conductive shaped particles 14 are included to cooperatively provide conductivity through the thickness of the article 10 when it is in use (e.g., subjected to compression between two materials).

Figure 16:
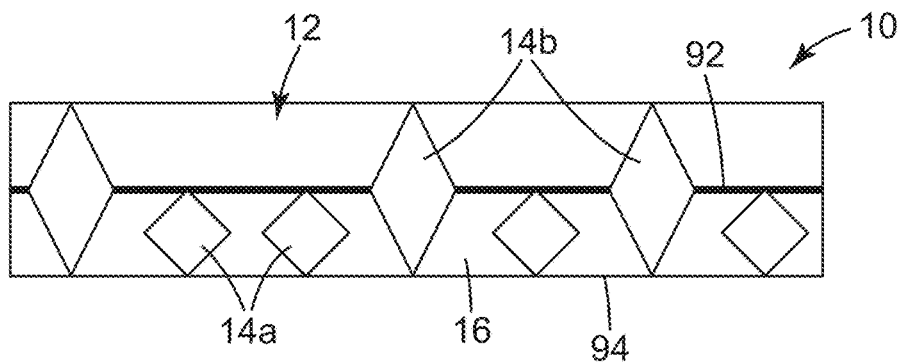
FIG. 16 is a cross-sectional schematic of an exemplary electrically conductive article including shaped particles comprising diamond shapes having two monosized distributions, and an interior substrate.

FIG. 16 provides a cross-sectional schematic of an exemplary electrically conductive article 10, including a composite 12 comprising a first plurality of electrically conductive shaped particles 14a and a second plurality of electrically conductive shaped particles 14b, each comprising a diamond shape, distributed in a resin 16. The article further includes an electrically conductive internal substrate 92 positioned approximately in the center of the thickness of the article 10. The height of the first plurality of electrically conductive shaped particles 14a allows the particles to contact both the internal substrate 92 and one major surface 94 of the composite 12, whereas the height of the second plurality of electrically conductive shaped particles 14b (approximately twice that of the first shaped particles 14a) allows the second shaped particles 14b to contact both major surfaces of the composite 12, and penetrate through the internal substrate 92, to provide conductivity through the thickness of the article 10 when it is in use (e.g., subjected to compression between two materials).

Figure 17:
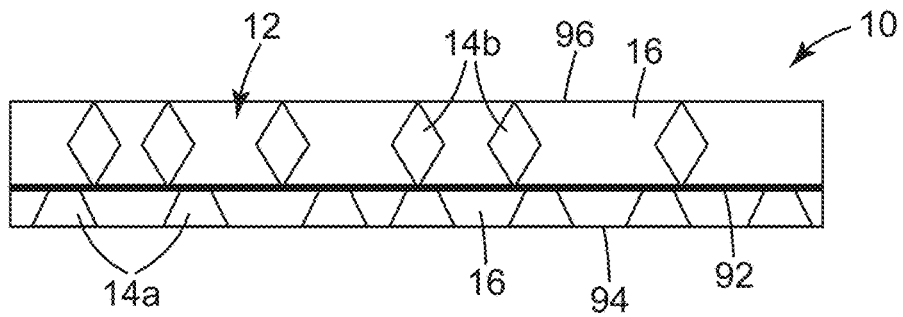
FIG. 17 is a cross-sectional schematic of an exemplary electrically conductive article including shaped particles comprising diamond shapes and trapezoid shapes, and an interior substrate.

FIG. 17 provides a cross-sectional schematic of an exemplary electrically conductive article 10, including a composite 12 comprising a first plurality of electrically conductive shaped particles 14a comprising a trapezoid shape and a second plurality of electrically conductive shaped particles 14b comprising a diamond shape, distributed in a resin 16. The article further includes an electrically conductive internal substrate 92 positioned at approximately one third of the distance of the thickness of the article 10. The height of the first plurality of electrically conductive shaped particles 14a allows the particles to contact both the internal substrate 92 and a first major surface 94 of the composite 12, whereas the height of the second plurality of electrically conductive shaped particles 14b allows the particles to contact both the internal substrate and a second, opposing, major surface 96 of the composite 12. Hence, one row of the first shaped particles 14a and one row of the second shaped particles 14b are included to cooperatively provide conductivity through the thickness of the article 10 when it is in use (e.g., subjected to compression between two materials).

Figure 18:
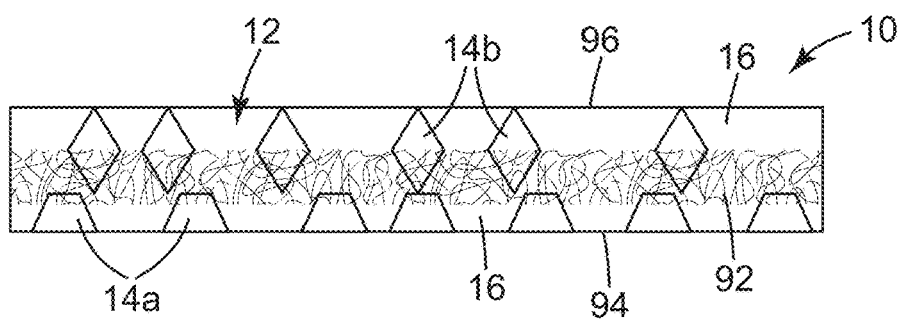
FIG. 18 is a cross-sectional schematic of another exemplary electrically conductive article including shaped particles comprising diamond shapes and trapezoid shapes, and an interior substrate.

FIG. 18 provides a cross-sectional schematic of an exemplary electrically conductive article 10, including a composite 12 comprising a first plurality of electrically conductive shaped particles 14a comprising a trapezoid shape and a second plurality of electrically conductive shaped particles 14b comprising a diamond shape, distributed in a resin 16. The article further includes an electrically conductive internal substrate 92 positioned approximately in the center of the thickness of the article 10. The height of the first plurality of electrically conductive shaped particles 14a allows the particles to contact both the internal substrate and a first major surface 94 of the composite 12, whereas the height of the second plurality of electrically conductive shaped particles 14b allows the particles to contact both the internal substrate 92 and a second, opposing, major surface 96 of the composite 12. The electrically conductive shaped particles partially penetrate the internal electrically conductive substrate 92 due to its loose, nonwoven (or in some cases woven) structure. Hence, one row of the first shaped particles 14a and one row of the second shaped particles 14b are included to cooperatively provide conductivity through the thickness of the article 10 when it is in use (e.g., subjected to compression between two materials).

Advantageously, the electrically conductive article exhibits a contact resistance of the z-axis of less than 100.00 ohms, or less than 10.00 ohms, or less than 2.00 ohms, or less than 0.05 ohms, such as between 0.005 and 1.00 ohms, or between 0.05 and 1.00 ohms, or between 0.05 and 0.80 ohms, or between 0.05 and 0.60 ohms, or between 0.05 and 0.40 ohms, or between 0.005 and 0.40 ohms, as measured by standard contact resistance tests.

Various Items are Described that are Articles or Methods of Making Articles.

Item 1 is an electrically conductive article including a composite including (a) a resin, and (b) electrically conductive shaped particles distributed in the resin, the particles having a monosized distribution. Each particle has a shape including at least a first surface and a second surface intersecting the first surface at an angle α between about 5 degrees and about 150 degrees. The composite has a thickness.

Item 2 is an electrically conductive article of item 1, wherein each of the particles distributed in the resin is oriented within the resin such that the particle does not extend beyond the thickness of the composite.

Item 3 is an electrically conductive article of item 1 or item 2, wherein the angle α is between about 15 degrees and about 135 degrees.

Item 4 is an electrically conductive article of any one of items 1 through 3, wherein the angle α is between about 5 degrees and about 85 degrees.

Item 5 is an electrically conductive article of any one of items 1 through 4, wherein the angle α is between about 10 degrees and about 75 degrees.

Item 6 is an electrically conductive article of any one of items 1 through 3, wherein the angle α is between about 90 degrees and about 150 degrees.

Item 7 is an electrically conductive article of any one of items 1 through 6, wherein each of the electrically conductive shaped particles includes a metal coating having an average thickness between 1 micrometers (μm) and 50 μm.

Item 8 is an electrically conductive article of any one of items 1 through 7, wherein each of the electrically conductive shaped particles includes a metal coating having an average thickness between 1 micrometers (μm) and 20 μm.

Item 9 is an electrically conductive article of any one of items 1 through 8, wherein each of the electrically conductive shaped particles has a height and a width and has a ratio of height:width of between 2:1 and 1:1.

Item 10 is an electrically conductive article of any one of items 1 through 9, wherein each of the electrically conductive shaped particles includes between 10 percent by weight (wt. %) metal and 40 wt. % metal.

Item 11 is an electrically conductive article of any one of items 1 through 10, wherein each of the plurality of shaped electrically conductive particles includes between 10 wt. % metal and 20 wt. % metal.

Item 12 is an electrically conductive article of any one of items 1 through 10, wherein each of the electrically conductive shaped particles includes between 25 wt. % metal and 40 wt. % metal.

Item 13 is an electrically conductive article of any one of items 1 through 12, wherein the first surface includes a triangle shape, a diamond shape, a rectangle shape, a rhombus shape, a kite shape, a trapezoid shape, a star shape, a hexagon shape, an octagon shape, or a hemisphere shape.

Item 14 is an electrically conductive article of any one of items 1 through 12, wherein each of the electrically conductive shaped particles includes a shape comprising at least three surfaces meeting in a point.

Item 15 is an electrically conductive article of any one of items 1 through 12, wherein each of the electrically conductive shaped particles includes a pyramid shape, a cone shape, a cube shape, a frusto-pyramid shape, a truncated sphere shape, or a frusto-conical shape.

Item 16 is an electrically conductive article of any one of items 1 through 15, wherein each of the electrically conductive shaped particles includes a three-sided pyramid shape, a four-sided pyramid shape, a five-sided pyramid shape, a five-sided triangle shape, or a diamond shape.

Item 17 is an electrically conductive article of any one of items 1 through 16, wherein each of the electrically conductive shaped particles has a core including alumina, zirconia, yttria, yttria-stabilized zirconia, silica, titanium carbide, boron carbide, boron nitride, or silicon carbide.

Item 18 is an electrically conductive article of any one of items 1 through 17, wherein each of the electrically conductive shaped particles has a core including alumina Item 19 is an electrically conductive article of any one of items 1 through 18, wherein the electrically conductive shaped particles have an average particle size of between 5 μm and 100 μm.

Item 20 is an electrically conductive article of any one of items 1 through 19, wherein the electrically conductive shaped particles have an average particle size of between 5 μm and 50 μm.

Item 21 is an electrically conductive article of any one of items 1 through 20, wherein the electrically conductive shaped particles have an average particle size of between 5 μm and 25 μm.

Item 22 is an electrically conductive article of any one of items 1 through 20, wherein the electrically conductive shaped particles have an average particle size of between 10 μm and 35 μm.

Item 23 is an electrically conductive article of any one of items 1 through 19, wherein the electrically conductive shaped particles have an average particle size of between 30 μm and 75 μm.

Item 24 is an electrically conductive article of any one of items 1 through 19, wherein the electrically conductive shaped particles have an average particle size of between 50 μm and 75 μm.

Item 25 is an electrically conductive article of any one of items 1 through 24, wherein each of the electrically conductive shaped particles has a metal coating including aluminum, silver, copper, gold, or alloys thereof.

Item 26 is an electrically conductive article of any one of items 1 through 25, wherein each of the electrically conductive shaped particles has a metal coating including silver or copper.

Item 27 is an electrically conductive article of any one of items 1 through 24, wherein each of the electrically conductive shaped particles has a core including aluminum, silver, copper, gold, or alloys thereof.

Item 28 is an electrically conductive article of any one of items 1 through 27, wherein the composite includes between 5 wt. % and 75 wt. % of the electrically conductive shaped particles.

Item 29 is an electrically conductive article of any one of items 1 through 28, wherein the composite includes between 5 wt. % and 25 wt. % of the electrically conductive shaped particles.

Item 30 is an electrically conductive article of any one of items 1 through 29, wherein the composite includes between 5 wt. % and 10 wt. % of the electrically conductive shaped particles.

Item 31 is an electrically conductive article of any one of items 1 through 28, wherein the composite includes between 10 wt. % and 50 wt. % of the electrically conductive shaped particles.

Item 32 is an electrically conductive article of any one of items 1 through 28, wherein the composite includes between 10 wt. % and 30 wt. % of the electrically conductive shaped particles.

Item 33 is an electrically conductive article of any one of items 1 through 28, wherein the composite includes between 25 wt. % and 75 wt. % of the electrically conductive shaped particles.

Item 34 is an electrically conductive article of any one of items 1 through 27, wherein the composite includes between 0.1 volume percent (vol. %) and 15 vol. % of the electrically conductive shaped particles.

Item 35 is an electrically conductive article of any one of items 1 through 27, wherein the composite includes between 0.5 vol. % and 5 vol. % of the electrically conductive shaped particles.

Item 36 is an electrically conductive article of any one of items 1 through 27, wherein the composite includes between 1 vol. % and 15 vol. % of the electrically conductive shaped particles.

Item 37 is an electrically conductive article of any one of items 1 through 27, wherein the composite includes between 1 vol. % and 10 vol. % of the electrically conductive shaped particles.

Item 38 is an electrically conductive article of any one of items 1 through 27, wherein the composite includes between 5 vol. % and 10 vol. % of the electrically conductive shaped particles.

Item 39 is an electrically conductive article of any one of items 1 through 38, wherein the composite has a thickness between 5 μm and 200 μm.

Item 40 is an electrically conductive article of any one of items 1 through 39, wherein the composite has a thickness between 5 μm and 50 μm.

Item 41 is an electrically conductive article of any one of items 1 through 40, wherein the composite has a thickness between 5 μm and 25 μm.

Item 42 is an electrically conductive article of any one of items 1 through 40, wherein the composite has a thickness between 10 μm and 35 μm.

Item 43 is an electrically conductive article of any one of items 1 through 39, wherein the composite has a thickness between 50 μm and 100 μm.

Item 44 is an electrically conductive article of any one of items 1 through 39, wherein the composite has a thickness between 30 μm and 100 μm.

Item 45 is an electrically conductive article of any one of items 1 through 44, wherein the resin includes a thermoset polymer, a thermoplastic polymer, or an elastomeric polymer.

Item 46 is an electrically conductive article of any one of items 1 through 45, wherein the resin includes an epoxy, a polyurea, an acrylic, a cyanoacrylate, a polyamide, a phenolic, a polyimide, a silicone, a polyester, an aminoplast, a melamine, an acrylated epoxy, a urethane, polyvinyl chloride, or a combination thereof.

Item 47 is an electrically conductive article of any one of items 1 through 44, wherein the resin includes a pressure-sensitive adhesive, a liquid adhesive, a hot melt adhesive, or a structural adhesive.

Item 48 is an electrically conductive article of any one of items 1 through 47, wherein the composite further includes a plurality of conductive fillers having an aspect ratio of length to height of greater than 2:1.

Item 49 is an electrically conductive article of any one of items 1 through 48, wherein the composite further includes a plurality of conductive fillers having an aspect ratio of length to height of greater than 4:1.

Item 50 is an electrically conductive article of any one of items 1 through 44, wherein the composite further includes a plurality of conductive fillers having an aspect ratio of length to height of greater than 10:1.

Item 51 is an electrically conductive article of any one of items 48 through 50, wherein the plurality of conductive fillers includes fibers coated with metal.

Item 52 is an electrically conductive article of item 50, wherein the fibers include glass, polymer, carbon, or ceramic.

Item 53 is an electrically conductive article of any one of items 48 through 50, wherein the plurality of conductive fillers includes carbon black or graphene based materials.

Item 54 is an electrically conductive article of item 53, wherein the graphene based materials include doped or undoped graphene.

Item 55 is an electrically conductive article of item 53 or item 54, wherein the graphene based materials include flakes, exfoliated graphite, graphene nanoplatelets, functionalized graphene sheets, or a combination thereof.

Item 56 is an electrically conductive article of any one of items 1 through 55, further including a substrate, wherein the composite is attached to a major surface of the substrate.

Item 57 is an electrically conductive article of item 56, wherein the substrate includes a metal foil, a polymer, or a fabric.

Item 58 is an electrically conductive article of item 56 or item 57, wherein the substrate comprises fabric.

Item 59 is an electrically conductive article of any one of items 1 through 58, wherein the composite exhibits a contact resistance of the z-axis of between 0.005 and 1.00 ohms as measured by the Z-Axis Resistance Test.

Item 60 is an electrically conductive article of any one of items 1 through 59, wherein the composite exhibits a contact resistance of the z-axis of between 0.05 and 0.60 ohms as measured by the Z-Axis Resistance Test.

Item 61 is an electrically conductive article of any one of items 1 through 60, wherein the intersection of the first surface and the second surface of at least 80% of the electrically conductive shaped particles is oriented in the resin normal to a major surface of the composite.

Item 62 is an electrically conductive article of any one of items 1 through 61, wherein the intersection of the first surface and the second surface of at least 90% of the electrically conductive shaped particles is oriented in the resin normal to a major surface of the composite.

Item 63 is an electrically conductive article of any one of items 1 through 62, wherein the intersection of the first surface and the second surface of at least 95% of the electrically conductive shaped particles is oriented in the resin normal to a major surface of the composite.

Item 64 is an electrically conductive article of any one of items 1 through 63, wherein at least 90% of the particles in the monosized distribution comprise a surface area that does not vary by more than 5% of the average surface area of all of the particles in the distribution.

Item 65 is an electrically conductive article of any one of items 1 through 64, wherein at least 90% of the particles in the monosized distribution comprise a surface area that does not vary by more than 3% of the average surface area of all of the particles in the distribution.

Item 66 is an electrically conductive article of any one of items 1 through 65, wherein at least 90% of the particles in the monosized distribution comprise a surface area that does not vary by more than 2% of the average surface area of all of the particles in the distribution.

Item 67 is an electrically conductive article of any one of items 1 through 66, wherein at least 90% of the particles in the monosized distribution comprise a surface area that does not vary by more than 1% of the average surface area of all of the particles in the distribution.

Item 68 is a method for making an electrically conductive article including (a) providing electrically conductive shaped particles having a monosized distribution, and (b) distributing the electrically conductive shaped particles into a resin to form a composite. Each particle has a shape including at least a first surface and a second surface intersecting the first surface at an angle α between about 5 degrees and about 150 degrees. The composite has a thickness.

Item 69 is a method of item 68, wherein the providing the electrically conductive shaped particles includes molding a core of each of the electrically conductive shaped particles.

Item 70 is a method of item 69, wherein each of the electrically conductive shaped particles has a core including alumina, zirconia, yttria, yttria-stabilized zirconia, silica, titanium carbide, boron carbide, boron nitride, or silicon carbide.

Item 71 is a method of item 69 or item 70, wherein each of the electrically conductive shaped particles has a core including alumina Item 72 is a method of any one of items 69 through 71, wherein each of the electrically conductive shaped particles has a core including aluminum, silver, copper, gold, or alloys thereof.

Item 73 is a method of any one of items 69 through 71, wherein the providing the electrically conductive shaped particles further includes applying a metal coating to the core of each of the electrically conductive shaped particles to form the electrically conductive shaped particles.

Item 74 is a method of item 73, wherein the metal coating includes sputtering the metal onto the core of each of the electrically conductive shaped particles.

Item 75 is a method of any one of items 68 through 74, wherein each of the particles distributed in the resin is oriented within the resin such that the particle does not extend beyond the thickness of the composite.

Item 76 is a method of any one of items 68 through 75, wherein the angle α is between about 15 degrees and about 135 degrees.

Item 77 is a method of any one of items 68 through 75, wherein the angle α is between about 5 degrees and about 85 degrees.

Item 78 is a method of any one of items 68 through 75 or 77, wherein the angle α is between about 10 degrees and about 75 degrees.

Item 79 is a method of any one of items 68 through 75, wherein the angle α is between about 90 degrees and about 150 degrees.

Item 80 is a method of any one of items 68 through 79, wherein each of the electrically conductive shaped particles includes a metal coating having an average thickness between 1 micrometers (μm) and 50 μm.

Item 81 is a method of any one of items 68 through 80, wherein each of the electrically conductive shaped particles includes a metal coating having an average thickness between 1 micrometers (μm) and 20 μm.

Item 82 is a method of any one of items 68 through 81, wherein each of the electrically conductive shaped particles has a height and a width and has a ratio of height:width of between 2:1 and 1:1.

Item 83 is a method of any one of items 68 through 82, wherein each of the electrically conductive shaped particles includes between 10 percent by weight (wt. %) metal and 40 wt. % metal.

Item 84 is a method of any one of items 68 through 83, wherein each of the plurality of shaped electrically conductive particles includes between 10 wt. % metal and 20 wt. % metal.

Item 85 is a method of any one of items 68 through 83, wherein each of the electrically conductive shaped particles includes between 25 wt. % metal and 40 wt. % metal.

Item 86 is a method of any one of items 68 through 85, wherein each of the electrically conductive shaped particles has a surface including a triangle shape, a diamond shape, a rectangle shape, a rhombus shape, a kite shape, a star shape, a trapezoid shape, a hexagon shape, an octagon shape, or a hemisphere shape.

Item 87 is a method of any one of items 68 through 85, wherein each of the electrically conductive shaped particles has a shape including at least three surfaces meeting in a point.

Item 88 is a method of any one of items 68 through 85, wherein each of the electrically conductive shaped particles includes a pyramid shape, a cone shape, a cube shape, a frusto-pyramid shape, a truncated sphere shape, or a frusto-conical shape.

Item 89 is a method of any one of items 68 through 85, wherein each of the electrically conductive shaped particles comprises a three-sided pyramid shape, a four-sided pyramid shape, a five-sided pyramid shape, a five-sided triangle shape, or a diamond shape.

Item 90 is a method of any one of items 68 through 89, wherein the electrically conductive shaped particles have an average particle size of between 5 μm and 200 μm.

Item 91 is a method of any one of items 68 through 90, wherein the electrically conductive shaped particles have an average particle size of between 5 μm and 50 μm.

Item 92 is a method of any one of items 68 through 91, wherein the electrically conductive shaped particles have an average particle size of between 5 μm and 25 μm.

Item 93 is a method of any one of items 68 through 91, wherein the electrically conductive shaped particles have an average particle size of between 10 μm and 35 μm.

Item 94 is a method of any one of items 68 through 90, wherein the electrically conductive shaped particles have an average particle size of between 30 μm and 75 μm.

Item 95 is a method of any one of items 68 through 90, wherein the electrically conductive shaped particles have an average particle size of between 50 μm and 75 μm.

Item 96 is a method of any one of items 68 through 95, wherein each of the electrically conductive shaped particles includes a metal coating comprising aluminum, silver, copper, gold, or alloys thereof.

Item 97 is a method of any one of items 68 through 96, wherein each of the electrically conductive shaped particles includes a metal coating comprising silver or copper.

Item 98 is a method of any one of items 68 through 97, wherein the composite includes between 5 wt. % and 75 wt. % of the electrically conductive shaped particles.

Item 99 is a method of any one of items 68 through 98, wherein the composite includes between 5 wt. % and 25 wt. % of the electrically conductive shaped particles.

Item 100 is a method of any one of items 68 through 99, wherein the composite includes between 5 wt. % and 10 wt. % of the electrically conductive shaped particles.

Item 101 is a method of any one of items 68 through 98, wherein the composite includes between 10 wt. % and 50 wt. % of the electrically conductive shaped particles.

Item 102 is a method of any one of items 68 through 98, wherein the composite includes between 10 wt. % and 30 wt. % of the electrically conductive shaped particles.

Item 103 is a method of any one of items 68 through 98, wherein the composite includes between 25 wt. % and 75 wt. % of the electrically conductive shaped particles.

Item 104 is a method of any one of items 68 through 97, wherein the composite includes between 0.1 volume percent (vol. %) and 15 vol. % of the electrically conductive shaped particles.

Item 105 is a method of any one of items 68 through 97, wherein the composite includes between 0.5 vol. % and 25 vol. % of the electrically conductive shaped particles.

Item 106 is a method of any one of items 68 through 97, wherein the composite includes between 1 vol. % and 15 vol. % of the electrically conductive shaped particles.

Item 107 is a method of any one of items 68 through 97, wherein the composite includes between 1 vol. % and 10 vol. % of the electrically conductive shaped particles.

Item 108 is a method of any one of items 68 through 97, wherein the composite includes between 5 vol. % and 10 vol. % of the electrically conductive shaped particles.

Item 109 is a method of any one of items 68 through 108, wherein the composite includes a thickness between 5 μm and 100 μm.

Item 110 is a method of any one of items 68 through 109, wherein the composite includes a thickness between 5 μm and 50 μm.

Item 111 is a method of any one of items 68 through 110, wherein the composite includes a thickness between 5 μm and 25 μm.

Item 112 is a method of any one of items 68 through 110, wherein the composite includes a thickness between 10 μm and 35 μm.

Item 113 is a method of any one of items 68 through 109, wherein the composite includes a thickness between 50 μm and 100 μm.

Item 114 is a method of any one of items 68 through 109, wherein the composite includes a thickness between 30 μm and 100 μm.

Item 115 is a method of any one of items 68 through 114, wherein the resin includes a thermoset polymer, a thermoplastic polymer, or an elastomeric polymer.

Item 116 is a method of any one of items 68 through 115, wherein the resin includes an epoxy, a polyurea, an acrylic, a cyanoacrylate, a polyamide, a phenolic, a polyimide, a silicone, a polyester, an aminoplast, a melamine, an acrylated epoxy, a urethane, polyvinyl chloride, or a combination thereof.

Item 117 is a method of any one of items 68 through 114, wherein the resin includes a pressure-sensitive adhesive, a liquid adhesive, a hot melt adhesive, or a structural adhesive.

Item 118 is a method of any one of items 68 through 117, wherein the composite further includes a plurality of conductive fillers having an aspect ratio of length to height of greater than 2:1.

Item 119 is a method of any one of items 68 through 118, wherein the composite further includes a plurality of conductive fillers having an aspect ratio of length to height of greater than 4:1.

Item 120 is a method of any one of items 68 through 119, wherein the composite further includes a plurality of conductive fillers having an aspect ratio of length to height of greater than 10:1.

Item 121 is a method of any one of items 118 through 120, wherein the plurality of conductive fillers includes fibers coated with metal.

Item 122 is a method of item 121, wherein the fibers include glass, polymer, carbon, or ceramic.

Item 123 is a method of any one of items 118 through 121, wherein the plurality of conductive fillers includes carbon black or graphene based materials.

Item 124 is a method of item 123, wherein the graphene based materials include doped or undoped graphene.

Item 125 is a method of item 123 or item 124, wherein the graphene based materials include flakes, exfoliated graphite, graphene nanoplatelets, functionalized graphene sheets, or a combination thereof.

Item 126 is a method of any one of items 68 through 125, further comprising a substrate, wherein the composite is attached to a major surface of the substrate.

Item 127 is a method of item 126, wherein the substrate includes a metal foil, a polymer, or a fabric.

Item 128 is a method of item 126 or item 127, wherein the substrate includes fabric.

Item 129 is a method of any one of items 68 through 128, wherein the composite exhibits a contact resistance of the z-axis of between 0.05 and 1.00 ohms as measured by the Z-Axis Resistance Test.

Item 130 is a method of any one of items 68 through 129, wherein the composite exhibits a contact resistance of the z-axis of between 0.05 and 0.60 ohms as measured by the Z-Axis Resistance Test.

Item 131 is a method of any one of items 68 through 130, wherein the intersection of the first surface and the second surface of at least 80% of the electrically conductive shaped particles is oriented in the resin normal to a major surface of the composite.

Item 132 is a method of any one of items 68 through 131, wherein the intersection of the first surface and the second surface of at least 90% of the electrically conductive shaped particles is oriented in the resin normal to a major surface of the composite.

Item 133 is a method of any one of items 68 through 132, wherein the intersection of the first surface and the second surface of at least 95% of the electrically conductive shaped particles is oriented in the resin normal to a major surface of the composite.

Item 134 is a method of any one of items 68 through 133, wherein at least 90% of the particles in the monosized distribution have a surface area that does not vary by more than 5% of the average surface area of all of the particles in the distribution.

Item 135 is a method of any one of items 68 through 134, wherein at least 90% of the particles in the monosized distribution have a surface area that does not vary by more than 3% of the average surface area of all of the particles in the distribution.

Item 136 is a method of any one of items 68 through 135, wherein at least 90% of the particles in the monosized distribution have a surface area that does not vary by more than 2% of the average surface area of all of the particles in the distribution.

Item 137 is a method of any one of items 68 through 136, wherein at least 90% of the particles in the monosized distribution have a surface area that does not vary by more than 1% of the average surface area of all of the particles in the distribution.

Item 138 is a method of any one of items 68 through 137, wherein the composite further includes a plurality of thermally conductive fillers, EMI absorbing fillers, or a combination thereof.

EXAMPLES

Objects and advantages of this invention are further illustrated by the following examples, but the particular materials and amounts thereof recited in these examples, as well as other conditions and details, should not be construed to unduly limit this invention. These examples are for illustrative purposes only and are not meant to be limiting on the scope of the appended claims.

Preparation of 5-Sided Triangle Shaped Particles

A sample of boehmite sol-gel was made using the following recipe: aluminum oxide monohydrate powder (1600 parts) having the trade designation "DISPERAL" (commercially available from Sasol North America, Inc.) was dispersed by high shear mixing a solution containing water (2400 parts) and 70 percent aqueous nitric acid (72 parts) for 5 minutes. The resulting sol-gel was aged for at least 1 hour before coating. A mold release agent, 1 percent peanut oil in methanol was used to coat the production tooling with about 0.5 milligram per square inch (mg/in$^2$) (3.2 milligram per square centimeter (mg/cm$^2$)) of peanut oil applied to the production tooling. The sol-gel was forced into production tooling having triangular shaped mold cavities of 8 mils (203.2 micrometers (μm)) depth and 27 mils (685.8 μm) on each side. The draft angle α between the sidewall and bottom of the mold was 98 degrees. The sol-gel was forced into the cavities with a putty knife so that the openings of the production tooling were completely filled. Excess methanol was removed by placing sheets of the production tooling in an air convection oven for 5 minutes at 45 degrees Celsius. The sol-gel coated production tooling was placed in an air convection oven at 45 degrees Celsius for at least 45 minutes to dry. The precursor shaped abrasive particles were removed from the production tooling by passing it over an ultrasonic horn. The precursor shaped abrasive particles were calcined at approximately 650 degrees Celsius and then saturated with a mixed nitrate solution of the following concentration (reported as oxides): 1.8 percent each of MgO, $Y_2O_3$, $Nd_2O_3$ and $La_2O_3$. The excess nitrate solution was removed and the saturated precursor shaped abrasive particles with openings were allowed to dry after which the particles were again calcined at 650 degrees Celsius and sintered at approximately 1400 degrees Celsius. Both the calcining and sintering was performed using rotary tube kilns.

Preparation of 5-Sided Truncated Pyramid Shaped Particles 5-sided truncated pyramid shaped particles were produced using the same procedure described above except the production tooling was changed to a production tooling having right rhombic pyramidal shaped mold cavities of dimensions as shown in Table 1. During construction of the production tooling, the surfaces of the mold cavities were manufactured to have a series grooves with triangular cross sections. The grooves were 6 micrometers deep and had a 110 degree tip angle dimension.

TABLE 1

| Cavity maximum medium length, L (mm) | Cavity maximum medium width, W (mm) | Cavity medium thickness, T (mm) |
|---|---|---|
| 1.461 | 0.712 | 0.356 |

Test Methods
Z-Axis Resistance Test

An IPC Multi-Purpose test board (IPC-B-25A) (Diversified Systems, Inc, Indianapolis, Ind.) was used to measure the conductivity of the composite in the Z-axis direction. For measuring the conductivity in the z-axis direction (i.e., the thickness of the composite), the composite sample was laminated over a portion of a 2.7 millimeter (mm) wide, gold plated copper trace on a polyimide film. A portion of the gold plated copper trace was not covered by the composite. The polyimide test strip was laminated over the 2.1 mm wide traces on the IPC-B-25 test board. This defined a 2.1 mm by 2.7 mm overlap junction between the gold plated copper strip with the composite test sample and the two mm wide trace on the IPC-B-25 circuit board. Heat and pressure bonding, compression, or combinations thereof were available for non-adhesive composites. The portion of the gold plated copper trace that was not covered with the composite was clamped into contact with one of the other traces on the IPC test board. The resistance was measured by probing the IPC trace that was in contact with the composite and the IPC trace that was in contact with the gold plated trace on the polyimide film.

Samples were dwelled for 1 hour and for 24 hours at room temperature conditions (20-23° C. at 20-50% relative humidity) after the test configuration was set, prior to resistance testing.

Stainless Steel Resistance Test

The polyimide film and composite were applied to a Stainless Steel (SS) substrate with a section of the polyimide film away from the SS substrate. The overlap of the film/composite onto the SS substrate was 10 mm. The contact resistance was measured between the film and the SS substrate with resistance probes. Samples were dwelled for 1 hour and for 24 hours at room temperature conditions (20-23° C. at 20-50% relative humidity) after the test configuration was set, prior to resistance testing.

Sputtering Method

Figure 19A:
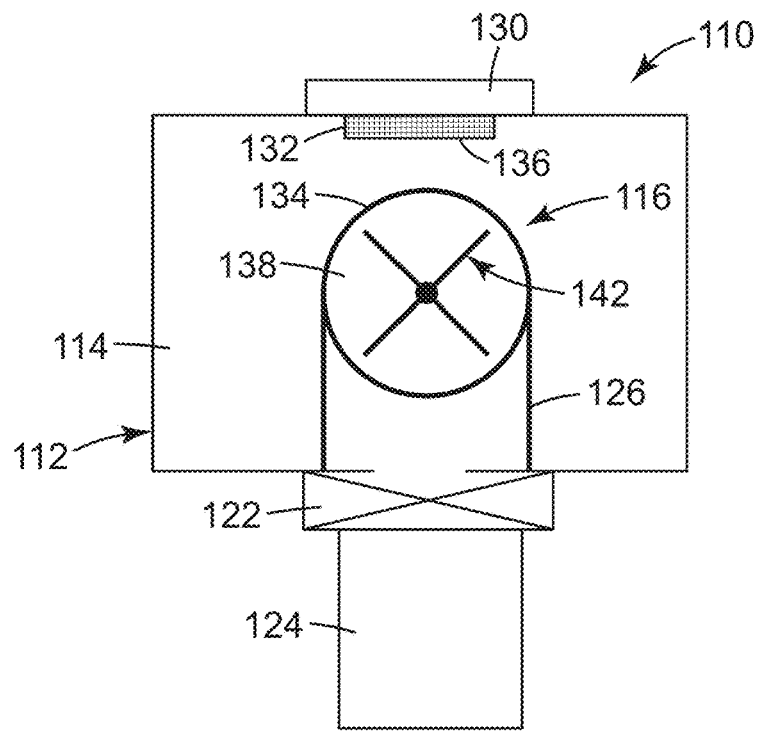
FIG. 19A is a cross-sectional schematic of a sputtering apparatus.
Figure 19B:
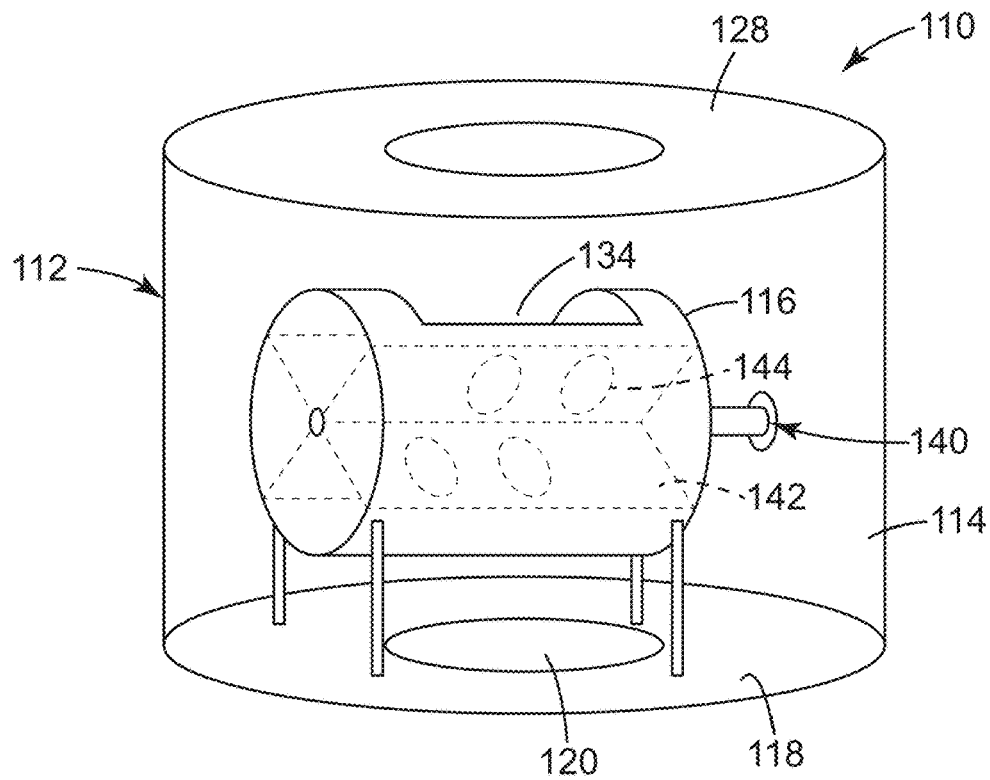
FIG. 19B is a perspective view of a schematic of a sputtering apparatus.

To make alumina shaped particles conductive, silver (Ag) metal, in an amount of 15 wt. % of the total weight of the particles, was coated on the particles using a sputtering process using the illustrated in FIGS. 19A and 19B. The apparatus 110 includes a housing 112 defining a vacuum chamber 114 containing a particle agitator 116. The housing 112, which may be made from an aluminum alloy if desired, is a vertically oriented hollow cylinder (45 centimeters (cm) high and 50 cm in diameter). The base 118 contains a port 120 for a high vacuum gate valve 122 followed by a six-inch diffusion pump 124 as well as a support 126 for the particle agitator 116. The chamber 114 is capable of being evacuated to background pressures in the range of $10^{-6}$ torr.

The top of the housing 112 includes a demountable, rubber L-gasket sealed plate 128 that is fitted with an external mount three-inch diameter dc magnetron sputter deposition source 130 (a US Gun II, US, INC., San Jose, Calif.). Into the source 130 is fastened a metal sputter target 132 (5 inches×8 inches and 0.5 inches thick) (12.7 cm×20.32 cm and 1.27 cm thick). The sputter source 130 is powered by an MDX-10 Magnetron Drive (Advanced Energy Industries, Inc, Fort Collins, Colo.) fitted with an arc suppressing Sparc-le 20 (Advanced Energy Industries, Inc, Fort Collins, Colo.).

The particle agitator 116 is a hollow cylinder (2.00 inches long×2.25 inches diameter horizontal) (5.08 cm long×5.715 cm diameter horizontal) with a rectangular opening 34 (1.25 inches×1.75 inches) (3.175 inches×4.445 inches) in the top 136. The opening 134 is positioned 7 centimeters directly below the surface 136 of the sputter target 132 so that sputtered metal atoms can enter the agitator volume 138. The agitator 116 is fitted with a shaft 140 aligned with its axis. The shaft 140 has a rectangular cross section to which are bolted four rectangular blades 142 which form an agitation mechanism or paddle wheel for the support particles being tumbled. The blades 142 each contain two holes 144 to promote communication between the particle volumes contained in each of the four quadrants formed by the blades 142 and agitator cylinder 116.

Forty cubic centimeters (cc) (125g) of alumina shaped particles were used as the substrate. Referring again to FIGS. 19A and 19B, the particles were placed into the particle agitator apparatus 110, and the chamber 114 was then evacuated. Once the chamber pressure was in the $10^{-5}$ torr range, the argon sputtering gas was admitted to the chamber 114 at a pressure of about 110 millitorr. Pure Ag metal was used as the sputter target 132. The deposition process was then started by applying a cathodic power of 2.00 kilowatts. The particle agitator shaft 140 was rotated at about 4 rpm during the Ag deposition process. The power was stopped after 6 hours. The chamber 114 was backfilled with air and the Ag coated particles were removed from the apparatus 110.

Materials

Unless otherwise noted, all parts, percentages, ratios, etc., in the examples and in the remainder of the specification are by weight. Unless otherwise noted, all chemicals were obtained from, or are available from, chemical suppliers such as Sigma-Aldrich Chemical Company, St. Louis, Mo.

TABLE 2

| Material | Product Details | Source |
|---|---|---|
| CLEARSIL Silicone Release Liners (T10, T50) | Liner film | Solutia Inc., St. Louis, MO |
| Aluminum Oxide Monohydrate Powder | Particle precursor material | Sasol North America, Inc. |
| Acrylate Syrup | Acrylate liquid pressure-sensitive adhesive | 3M Co., Hutchinson, MN |

Example 1

Electrically Conductive Adhesive Transfer Tape with 5-Sided Pyramid Alumina Shaped Particles An electrically conductive adhesive transfer tape was prepared. Example 1 shaped particles (see FIG. 10) were obtained and made conductive by coating silver metal on the particles according to the Sputtering Method above.

A mixture of Acrylate syrup Ag coated shaped alumina particles was prepared according to the sample formulation in Table 3 below. The mixture was put in a small glass container and a tongue depressor was used to mix the shaped particles in the syrup by hand. Finally, the mixture was poured out into a 6 inch (15.24 cm) width silicone coated polyester terephthalate (PET) release liner {T50 (125 µm thick) and T10 (50 µm thick)}, with the two release sides facing each other and coated using a notch bar coater.

Once the coating was complete it was cured with UV radiation from the top side for 10 minutes, using a Sylvania bulb at a power of 2.0-2.2 mW/cm$^2$, for a time of 10 minutes.

For the electrical conductivity characterization, test coupons were cut out and tested using the Stainless Steel Resistance Test above and the Z-Axis Resistance Test above.

Table 3 below lists the electrical data from Example 1. The contact resistance (R) data from the standard SS (stainless steel test) and the Z axis test show that all of the values of R are less than 1Ω.

Example 2

Electrically Conductive Adhesive Transfer Tape with 5-Sided Triangle Alumina Shaped Particles An electrically conductive adhesive transfer tape was prepared. Example 2 shaped particles (see FIG. 9) were obtained and made conductive by coating silver metal on the particles according to the Sputtering Method above.

A mixture of Acrylate syrup Ag coated shaped alumina particles was prepared according to the sample formulation in Table 3 below. The mixture was put in a small glass container and a tongue depressor was used to mix the shaped particles in the syrup by hand. Finally, the mixture was poured out into a 6 inch (15.24 cm) width silicone coated polyester terephthalate (PET) release liner {T50 (125 µm thick) and T10 (50 µm thick)}, with the two release sides facing each other and coated using a notch bar coater.

Once the coating was complete it was cured with UV radiation from the top side for 10 minutes, using a Sylvania bulb at a power of 2.0-2.2 mW/cm$^2$, for a time of 10 minutes.

For the electrical conductivity characterization, test coupons were cut out and tested using the Stainless Steel Resistance Test above and the Z-Axis Resistance Test above.

Table 3 below lists the electrical data from Example 2. The contact resistance (R) data from the standard SS (stainless steel test) and the Z axis test show that all of the values of R are less than 1 ohm (Ω), except for the Stainless Steel Test with a 24 hour dwell time.

TABLE 3

| Ex. # | Sample Formulation | Stainless Steel Test (1 hour dwell) (Ω) | Stainless Steel Test (24 hour dwell) (Ω) | Z-Axis Test (1 hour dwell) (Ω) | Z-Axis Test (24 hour dwell) (Ω) |
|---|---|---|---|---|---|
| 1 | 21.2 wt. % Ag coated truncated pyramid shaped particles + 78.8 wt. % Acrylate Syrup | 0.77 | 1.13 | 0.36 | 0.59 |
| 2 | 21.2 wt. % Ag coated triangle shaped particles + 78.8 wt. % Acrylate Syrup | 0.35 | 0.69 | 0.34 | 0.68 |

While the specification has described in detail certain exemplary embodiments, it will be appreciated that those skilled in the art, upon attaining an understanding of the foregoing, may readily conceive of alterations to, variations of, and equivalents to these embodiments. Furthermore, all publications and patents referenced herein are incorporated by reference in their entirety to the same extent as if each individual publication or patent was specifically and individually indicated to be incorporated by reference. Various exemplary embodiments have been described. These and other embodiments are within the scope of the following claims.

What is claimed is:

1. An electrically conductive article comprising:
   a composite comprising:
   (a) a resin; and
   (b) electrically conductive shaped particles distributed in the resin, the electrically conductive shaped particles having a monosized distribution, wherein at least 90% of the electrically conductive shaped particles in the monosized distribution comprise a dimensional surface area that does not vary by more than 15% of the average surface area of all of the electrically conductive shaped particles in the distribution and wherein each electrically conductive shaped particle comprises a shape comprising at least a first surface and a second surface intersecting the first surface at an angle α between about 5 degrees and about 150 degrees; wherein the composite comprises a thickness and a height of at least 90% of the electrically conductive shaped particles is within 95% to 100% of the thickness of the composite wherein each of the electrically conductive shaped particles comprises a metal coating comprising aluminum, silver, copper, nickel, gold, or alloys thereof.

2. The electrically conductive article of claim 1, wherein each of the electrically conductive shaped particles distributed in the resin is oriented within the resin such that the electrically conductive shaped particle does not extend beyond the thickness of the composite.

3. The electrically conductive article of claim 1, wherein each of the electrically conductive shaped particles comprises a metal coating having an average thickness between 1 micrometers (μm) and 50 μm.

4. The electrically conductive article of claim 1, wherein each of the electrically conductive shaped particles comprises a core comprising alumina, zirconia, yttria, yttria-stabilized zirconia, silica, titanium carbide, boron carbide, boron nitride, or silicon carbide.

5. The electrically conductive article of claim 1, wherein each of the electrically conductive shaped particles comprises a shape comprising at least three surfaces meeting in a point.

6. The electrically conductive article of claim 1, wherein the electrically conductive shaped particles comprise an average particle size of between 5 μm and 50 μm.

7. The electrically conductive article of claim 1, wherein the composite comprises between 0.5 vol. % and 25 vol. % of the electrically conductive shaped particles.

8. The electrically conductive article of claim 1, wherein the resin comprises an epoxy, a polyurea, an acrylic, a cyanoacrylate, a polyamide, a phenolic, a polyimide, a silicone, a polyester, an aminoplast, a melamine, an acrylated epoxy, a urethane, polyvinyl chloride, or a combination thereof.

9. The electrically conductive article of claim 1, wherein the composite further comprises a plurality of conductive fillers comprising an aspect ratio of length to height of greater than 2:1.

10. The electrically conductive article of claim 1, further comprising a substrate, wherein the composite is attached to a major surface of the substrate.

11. The electrically conductive article of claim 1, wherein each of the electrically conductive shaped particles comprises a core including aluminum, silver, copper, gold, or alloys thereof.

12. The electrically conductive article of claim 1, wherein the composite exhibits a contact resistance of the z-axis of between 0.05 and 0.60 ohms as measured by the Z-Axis Resistance Test.

13. The electrically conductive article of claim 1, wherein the resin comprises an acrylic pressure-sensitive adhesive.

14. The electrically conductive article of claim 1, wherein each of the electrically conductive shaped particles comprises a pyramid shape, a cone shape, a cube shape, a frusto-pyramid shape, a truncated sphere shape, a frusto-conical shape, a five-sided triangle shape, a diamond shape, or a combination thereof.

15. The electrically conductive article of claim 1, wherein the height of at least 90% of the electrically conductive shaped particles is within 96% to 100% of the thickness of the composite.

16. The electrically conductive article of claim 1, wherein each of the electrically conductive shaped particles is a precision shaped particle.

17. The electrically conductive article of claim 1, wherein each of the electrically conductive shaped particles has a shape that is the negative of a mold cavity.

18. The electrically conductive article of claim 1, wherein at least 90% of the electrically conductive shaped particles in the monosized distribution comprise a dimensional surface area that does not vary by more than 5% of the average surface area of all of the electrically conductive shaped particles in the distribution.

19. A method for making an electrically conductive article comprising:
  (a) providing electrically conductive shaped particles having a monosized distribution, wherein at least 90% of the electrically conductive shaped particles in the monosized distribution comprise a dimensional surface area that does not vary by more than 15% of the average surface area of all of the electrically conductive shaped particles in the distribution and wherein each electrically conductive shaped particle comprises a shape comprising at least a first surface and a second surface intersecting the first surface at an angle α between about 5 degrees and about 150 degrees; and
  (b) distributing the electrically conductive shaped particles into a resin to form a composite; wherein the composite comprises a thickness and a height of at least 90% of the electrically conductive shaped particles is within 95% to 100% of the thickness of the composite wherein the providing the electrically conductive shaped particles further comprises applying a metal coating comprising aluminum, silver, copper, nickel, gold, or alloys thereof to the core of each of the electrically conductive shaped particles to form the electrically conductive shaped particles.

20. The method of claim 19, wherein the providing the electrically conductive shaped particles comprises molding a core of each of the electrically conductive shaped particles.

21. The method of claim 19, wherein each of the electrically conductive shaped particles comprises a core comprising alumina, zirconia, yttria, yttria-stabilized zirconia, silica, titanium carbide, boron carbide, boron nitride, or silicon carbide.

22. The method of claim 19, wherein each of the electrically conductive shaped particles distributed in the resin is oriented within the resin such that the particle does not extend beyond the thickness of the composite.

23. The method of claim 19, wherein the composite exhibits a contact resistance of the z-axis of between 0.05 and 0.60 ohms as measured by the Z-Axis Resistance Test.

24. The method of claim 19, wherein at least 90% of the particles in the monosized distribution comprise a surface area that does not vary by more than 5% of the average surface area of all of the particles in the distribution.

* * * * *

UNITED STATES PATENT AND TRADEMARK OFFICE
CERTIFICATE OF CORRECTION

PATENT NO. : 10,785,900 B2
APPLICATION NO. : 15/027496
DATED : September 22, 2020
INVENTOR(S) : Dipankar Ghosh Page 1 of 1

It is certified that error appears in the above-identified patent and that said Letters Patent is hereby corrected as shown below:

In the Specification

Column 10,
Line 15, delete "alumina FIG. 9" and insert -- alumina. FIG. 9 --, therefor.

In the Claims

Column 29,
Line 13, in Claim 3, delete "a" and insert -- the --, therefor.

Signed and Sealed this
Third Day of November, 2020

Andrei Iancu
*Director of the United States Patent and Trademark Office*